(12) United States Patent
Ebel et al.

(10) Patent No.: US 7,381,583 B1
(45) Date of Patent: Jun. 3, 2008

(54) MEMS RF SWITCH INTEGRATED PROCESS

(75) Inventors: John L. Ebel, Beavercreek, OH (US); Rebecca Cortez, Xenia, OH (US); Richard E. Strawser, Greenville, OH (US); Kevin D. Leedy, Centerville, OH (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 211 days.

(21) Appl. No.: 10/901,315

(22) Filed: Jul. 27, 2004

Related U.S. Application Data

(60) Provisional application No. 60/573,892, filed on May 24, 2004.

(51) Int. Cl.
*H01L 21/00* (2006.01)
(52) U.S. Cl. ............... 438/53; 257/415; 257/E21.309; 200/181
(58) Field of Classification Search ............... 438/53; 257/419, E21.309, 415; 200/181; 333/105, 333/103
See application file for complete search history.

(56) References Cited

U.S. PATENT DOCUMENTS

| | | | |
|---|---|---|---|
| 5,090,254 | A | 2/1992 | Guckel et al. |
| 5,589,082 | A | 12/1996 | Lin et al. |
| 6,118,164 | A | 9/2000 | Seefeldt et al. |
| 6,133,807 | A * | 10/2000 | Akiyama et al. ........... 333/101 |
| 6,444,135 | B1 | 9/2002 | Hanabe et al. |
| 6,452,124 | B1 * | 9/2002 | York et al. ................. 200/181 |
| 6,452,238 | B1 | 9/2002 | Orcutt et al. |
| 6,472,739 | B1 | 10/2002 | Wood et al. |
| 6,621,387 | B1 | 9/2003 | Hopcroft |
| 6,635,509 | B1 | 10/2003 | Ouellet |
| 6,673,697 | B2 | 1/2004 | Ma et al. |
| 6,686,820 | B1 | 2/2004 | Ma et al. |
| 7,102,472 | B1 * | 9/2006 | Nathanson et al. ........... 335/78 |
| 2002/0075094 | A1 * | 6/2002 | Bechtle et al. .............. 333/105 |
| 2002/0171517 | A1 * | 11/2002 | Guo et al. .................. 333/262 |

(Continued)

OTHER PUBLICATIONS

E.R. Brown, "RF-MEMS Switches for Reconfigurable Integrated Circuits", IEEE Trans. on Microwave Theory and Techniques, Nov. 1998, pp. 1868-1880, vol. 46, No. 11.

J. Lee et al., "Monolithic 2-18 GHz Low Loss, On-Chip Based PIN Diode Switches", IEEE Trans. on Microwave Theory an dTechniques, Feb. 1995, pp. 250-255, vol. 43.

(Continued)

*Primary Examiner*—Bradley Baumeister
*Assistant Examiner*—Steven J Fulk
(74) *Attorney, Agent, or Firm*—Gerald B. Hollins

(57) ABSTRACT

A capacitance coupled, transmission line-fed, radio frequency MEMS switch and its fabrication process using photoresist and other low temperature processing steps are described. The achieved switch is disposed in a low cost dielectric housing free of undesired electrical effects on the switch and on the transmission line(s) coupling the switch to an electrical circuit. The dielectric housing is provided with an array of sealable apertures useful for wet, but hydrofluoric acid-free, removal of switch fabrication employed materials and also useful during processing for controlling the operating atmosphere surrounding the switch—e.g. at a pressure above the high vacuum level for enhanced switch damping during operation. Alternative arrangements for sealing an array of dielectric housing apertures are included. Processing details including plan and profile drawing views, specific equipment and materials identifications, temperatures and times are also disclosed.

17 Claims, 27 Drawing Sheets

U.S. PATENT DOCUMENTS

| | | | |
|---|---|---|---|
| 2003/0047533 A1 | 3/2003 | Reid et al. | |
| 2003/0155643 A1* | 8/2003 | Friedhoff | 257/704 |
| 2004/0173886 A1* | 9/2004 | Carley | 257/678 |
| 2005/0074919 A1* | 4/2005 | Patel et al. | 438/107 |

OTHER PUBLICATIONS

V.J. Kapoor, "InGaAs Microwave Switch Transistors for Phase Shifter Circuits", IEEE Trans. on Microwave Theory and Techniques, May 1994, pp. 772-778, vol. 42.

K. Leedy et al, "Metallization Schemes for RF MEMS Switches", J. Vacuum Science Technology, Jul./Aug. 2003, pp. 1172-1177, vol. A 21(4).

H. Elderstig and P. Wallgren, "Spin Deposition of Polymers over Holes and Cavities", Sensors and Actuators, 1995, pp. 95-97, vol. A 46-46.

M. Madou, *Fundamentals of Microfabrication*, 1997, p. 378, CRC Press, Boca Raton, Florida.

* cited by examiner

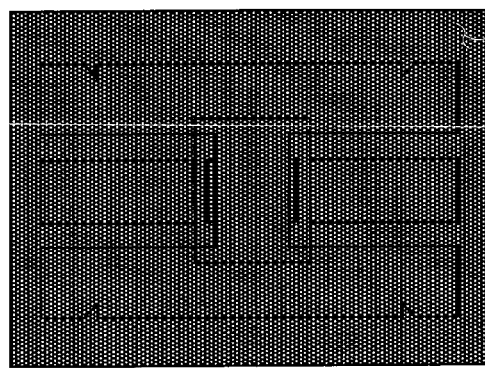# 
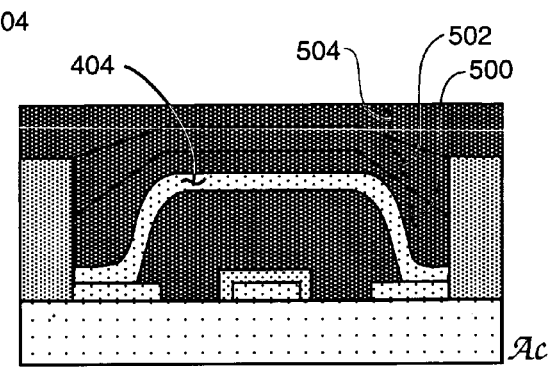
Fig. 5A        Fig. 5B
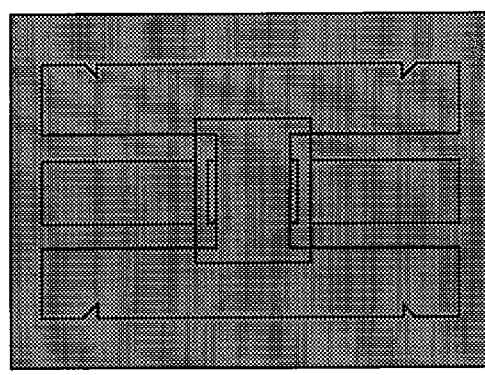
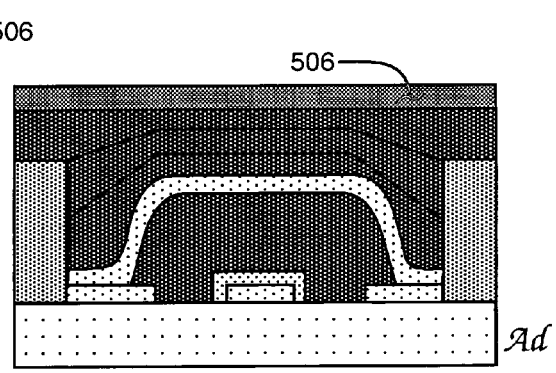
Fig. 5C        Fig. 5D
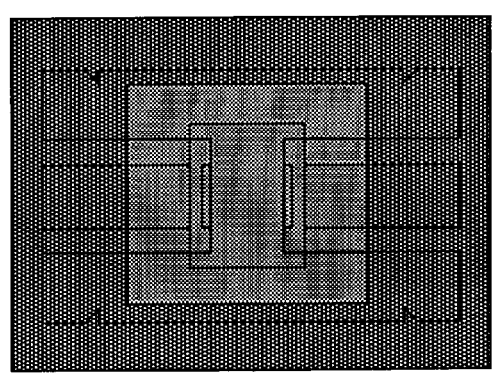
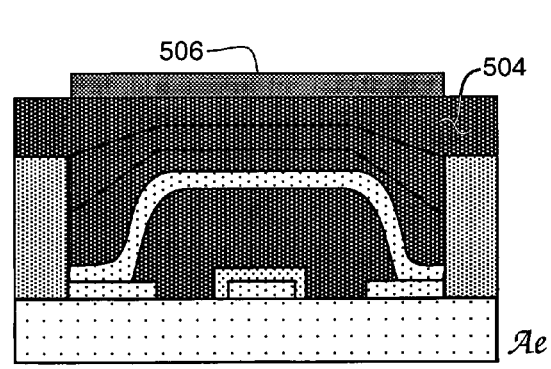
Fig. 5E        Fig. 5F

MEMS RF SWITCH INTEGRATED PROCESS

CLAIM OF PRIORITY

This application claims the benefit of U.S. Provisional Application No. 60/573,892 filed May 24, 2004. The contents of this provisional application are hereby incorporated by reference herein.

RIGHTS OF THE GOVERNMENT

The invention described herein may be manufactured and used by or for the Government of the United States for all governmental purposes without the payment of any royalty.

CROSS REFERENCE TO RELATED PATENT DOCUMENT

The present document is related to the and commonly assigned patent application document "MEMS RF SWITCH", AFD 729, Ser. No. 10/901,314, now U.S. Pat. No. 7,145,213; filed of even date herewith. The contents of this related even filing date document are hereby incorporated by reference herein.

BACKGROUND OF THE INVENTION

MEMS technology has numerous applications in both commercial and military electrical systems. MEMS switches, for instance, can be used in routing radio frequency and microwave frequency signals in high frequency circuits. Some advantages of MEMS switches used in this manner over other active devices such as field effect transistors (FETS) and positive intrinsic negative (PIN) diodes include lower signal loss, higher signal isolation, and lower power consumption for switch activation (In this regard see for example E. R. Brown, "RF-MEMS Switches for Reconfigurable Integrated Circuits," *IEEE Trans. On Microwave Theory and Techniques*, Vol. 46, No. 11, November 1998, p. 1868-1880; J. Lee, et al. "Monolithic 2-18 GHz Low Loss, On-Chip Biased PIN Diode Switches," *IEEE Trans. On Microwave Theory and Techniques*, Vol. 43, February 1995, p. 250-255; M. Shokrani and V. J. Kapoor, "InGaAs Microwave Switch Transistors for Phase Shifter Circuits," *IEEE Trans. On Microwave Theory and Techniques*, Vol. 42, May 1994, p. 772-778.)

A MEMS package ideally should be economical in materials cost, space requirements, and incorporation technique. A MEMS packaging arrangement must protect the enclosed switch from structural damage and contaminants, allow handling, conform to the RF requirements of the host system, be low cost, and not impede the performance of the switch or circuit. Some estimates attribute more than 70% of overall device costs to packaging (see for example M. Madou, *Fundamentals of Microfabrication*, CRC Press, Boca Raton, Fla., 1997, p. 378).

Several approaches exist for packaging MEMS switches. The "chip-in-a-box" approach entails dicing of un-released switch wafers, die attachment, interconnection, switch release, and lid seal. This process requires die level handling and release of switches inside the packages. A second approach is a wafer bonding arrangement that requires a capping wafer and a bonding ring around the switch (see e.g., U.S. Pat. No. 6,452,238, J. W. Orcutt, et al., "MEMS Wafer Level Package," Sep. 17, 2002). Bonding arrangements may incorporate solder, eutectic, and epoxy materials. These arrangements involve low temperature processes and may result in a high aspect ratio device due to the combined thickness of the switch and the capping wafer.

The on-wafer encapsulation approach of the present invention encapsulates the switches during the fabrication process, thus eliminating die handling issues and bonding ring requirements. In principle, the encapsulation of the present invention is similar to transistor passivation and requires no additional footprint or special wafer handling. The present invention-encapsulated switches, may be diced, integrated and packaged along with other circuits of the system. The encapsulation approach is scalable to any size wafer.

The U.S. Pat. No. 5,589,082 of Liwei Lin et al. discloses a MEMS device of the electromechanical filter type that appears of interest with respect to the present invention. In FIGS. 7Q, 7R and 7S of the Lin et al. patent there is shown a sequence of three fabrication views for a filter in which capping, releasing and sealing of the MEMS enclosure are accomplished. Although several aspects of this capping, releasing and sealing sequence may appear closely related to the present invention it is interesting to note distinctions in at least the fabrication materials used, the fabrication temperatures used and the ambient pressure established in the completed MEMS enclosure.

The U.S. Pat. No. 5,589,082 of Qing Ma et al. discloses an assemblage of semiconductor components into a solder-seal-ring-closed package. These components include film bulk acoustic resonators and MEMS switches. The emphasis of the Ma et al. disclosure centers around packaging semiconductor devices (referred to as microelectromechanical systems) by solder sealing two separate structures along a sealing ring extending around a cavity containing the microelectromechanical system. Ma et al. also teach use of surface mount techniques, including application of solder bumps to package the electrical components. Interconnection to the cavity is through via holes in the thinned Ma et al. wafer. The present invention however includes packaging of individual RF MEMS switches using a wafer scale approach built on surface micromachining procedures consistent with the fabrication of MEMS switches. No change in a normal fabrication technique is needed for the present invention. The present invention also does not require the use of vias or wafer thinning.

SUMMARY OF THE INVENTION

The present invention provides an integrated multi-step wafer-scale fabrication and packaging process for realizing individual RF MEMS switches. The packaging is directly integrated into the switch surface micromachining process used to build the RF MEMS switch. The achieved packaging is compatible with both capacitive and metal-to-metal contact switches.

It is therefore an object of the present invention to provide an encapsulated MEMS switch process.

It is another object of the invention to provide an encapsulated MEMS switch process allowing for post processing operations such as wafer dicing, die pick-and-place, and die attach.

It is another object of the invention to provide a MEMS processing arrangement inclusive of the three major portions of switch fabrication, dielectric switch encapsulation and package sealing using a liquid or gaseous phase sequence.

It is another object of the invention to provide a MEMS switch packaging arrangement that is usable with either a metal-to-metal contact or a capacitive coupled switch arrangement.

It is another object of the invention to provide a MEMS switch packaging arrangement inclusive of a new encapsulation attachment materials combination.

It is another object of the invention to provide a MEMS switch packaging arrangement in which the environment within the MEMS enclosure can be freely selected to be that most favorable for switch operation.

It is another object of the invention to provide a MEMS switch process in which switch fabrication and frozen switch capping can be achieved in a single sequence.

It is another object of the invention to provide a MEMS switch in which switch package sealing can be accomplished by a plurality of different arrangements.

It is another object of the invention to provide a MEMS switch packaging process employing relatively low temperature materials, materials having processing temperatures compatible with the MEMS switch.

It is another object of the invention to provide a MEMS switch fabrication and packaging process in which temperatures not exceeding 270° C. are used.

It is another object of the invention to provide a MEMS switch enclosure process in which dielectric materials are used in order to avoid signal transmission line perturbations attending metallic material enclosures.

It is another object of the invention to provide a MEMS switch enclosure process in which internal pressures above vacuum level are achievable in order to provide permanent physical damping for moving switch components.

These and other objects of the invention will become apparent as the description of the representative embodiments proceeds.

These and other objects of the invention are achieved by the limited temperature organic photoresist coating materials based MEMS switch realization method comprising the steps of:

fabricating metallic elements of said switch in a sequence of photoresist coating, masking, exposing and etching steps ending with MEMS switch elements being held captive on an insulating substrate in a sacrificial layer of said photoresist coating materials;

enclosing said captive switch elements in a dielectric shell using additional of said photoresist coating, masking, exposing and etching steps compatible with both said fabricating step photoresist coating, masking, exposing and etching steps and with structure formed during said fabricating step photoresist coating, masking, exposing and etching steps;

said enclosing step including forming in said dielectric shell a plurality of apertures communicating from outside to inside thereof;

wet releasing said switch elements from captivity within said dielectric shell by said sacrificial layer of said photoresist coating materials by way of reagent received through said plurality of apertures communicating from outside to inside of said dielectric shell;

covering said plurality of apertures communicating from outside to inside of said dielectric shell with a coating material temperature compatible with said switch elements and with said dielectric shell.

BRIEF DESCRIPTION OF THE DRAWINGS

The accompanying drawings incorporated in and forming a part of the specification, illustrate several aspects of the present invention and together with the description serve to explain the principles of the invention. In the drawings.

DETAILED DESCRIPTION OF THE INVENTION

Figure 1A:
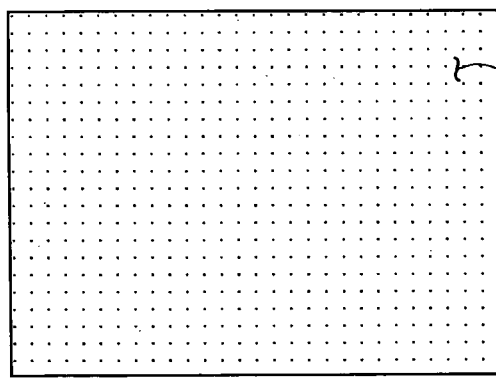
FIG. 1 in the drawings includes the views of FIG. 1A through FIG. 1P and shows a lower layer metal fabrication sequence for a MEMS switch according to the present invention.

The following detailed description of the invention is divided according to the major steps in fabricating a MEMS radio frequency switch device according to the invention. These major steps are generally identified as switch metal fabrication, dielectric switch encapsulation and switch sealing using a liquid or gaseous phase sequence as have been heretofore identified herein. The process described herein accomplishes a capacitance operated MEMS switch; the process is however equally relevant to a metal contact switch.

RF Metal Process

RF metal defines the bottom contact in a capacitive switch arrangement according to the invention. The metal thickness used determines the power handling capability of the switch. High power switches require thick metal (greater than 1 micrometer) that in turn requires planarization processing. Fabrication of an RF metal layer is preferably accomplished according to the steps represented in the FIG. 1 drawing, including the steps of FIG. 1A through FIG. 1P. In this FIG. 1 drawing and each other FIG. 1 through FIG. 9 drawing herein the left hand or odd-lettered steps represent a top view of the work piece and the right hand or even-lettered steps a side or profile view. Thick metal planarization is discussed in connection with the steps identified with the letters h and p in the sequence disclosed below.

By way of explanation, in the following description each fabrication step is provided with a plurality of identifications and correlation keys with an associated drawing of this document. For example each step in this description includes one or more references to a drawing FIG. This FIG. reference in most instances also includes use of a identifier having a numerical value in accordance with the drawing number involved—including a hundreds digit corresponding to the drawing number (e.g. the numerical identifier 802 appears in an individual drawing of FIG. 8, i.e., in FIG. 8D). Moreover the included identifications and correlation keys also include step identifications using the lower case alphabetical letter combinations between "a" and "Aae" as appear generally in the right hand lower portion of most drawing FIGs. These lower case alphabetical letter combinations between "a" and "Aae" do not however directly correlate with the lower case alphabetic letters identifying individual steps in the following discussion sequence.

The MEMS switch fabrication sequence may include the following steps.

Figure 1B:
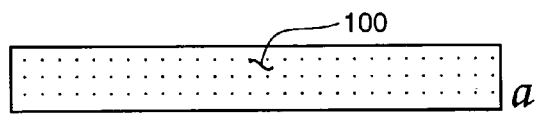
Figure 1C:
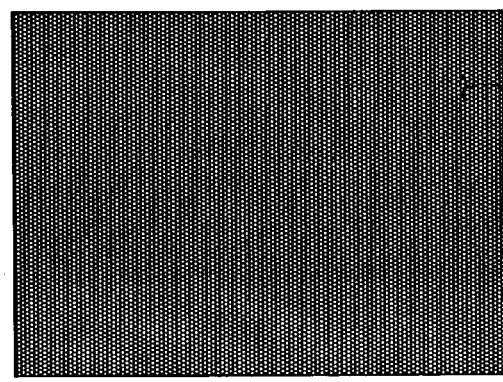
Figure 1D:
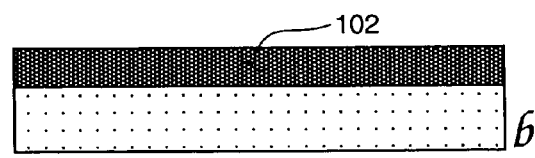

Fabrication begins in FIGS. 1A, and 1B with a bare high resistivity wafer substrate 100, such as sapphire.

Spin coat the wafer substrate 100 with one coat of a photo-imagable PolydiMethylGlutarImide (PMGI) polymer photoresist 102 such as Micro Chem. Corp. NANO PMGI SF-11 photoresist, FIGS. 1C and 1D, cure at 270° C. on a hot plate or in an oven.

Figure 1E:
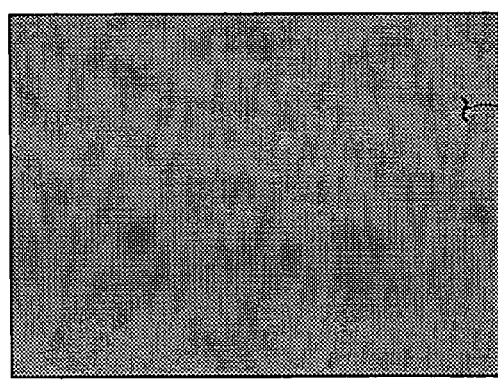
Figure 1F:
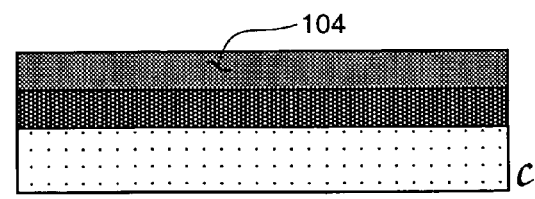

Spin coat the wafer substrate with one coat of a photo-imagable positive photoresist such as Shipley Microposit S-1813 photoresist 104, FIGS. 1E and 1F, cure at 110° C. on a hot plate or in an oven.

Figure 1G:
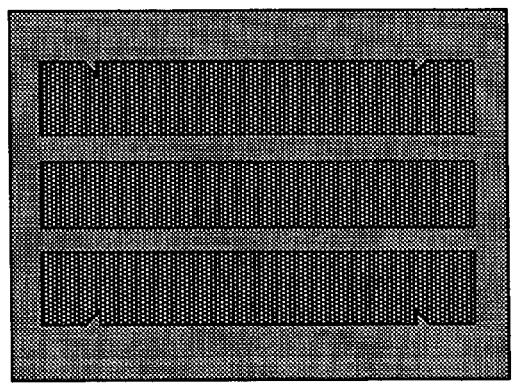
Figure 1H:
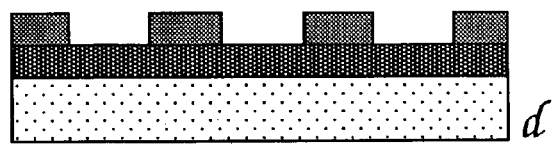
Figure 1I:
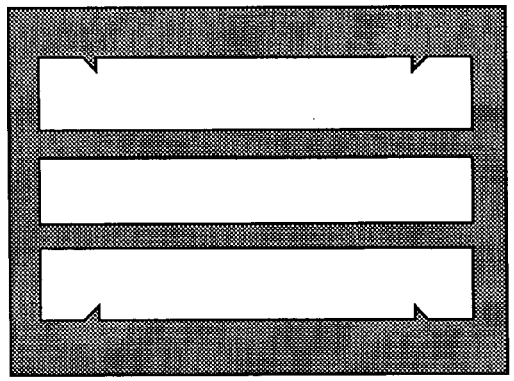
Figure 1J:
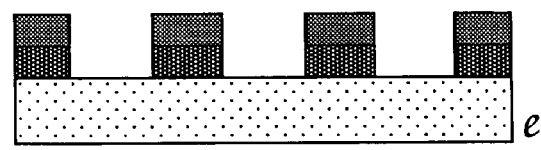
Figure 1K:
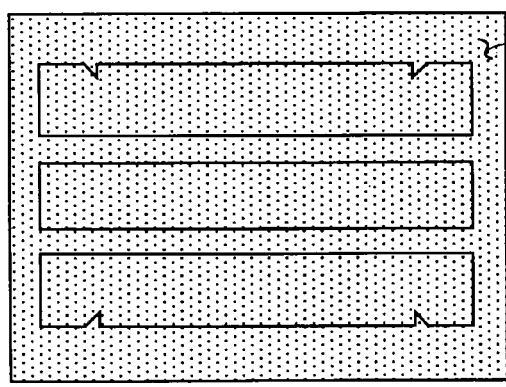
Figure 1L:
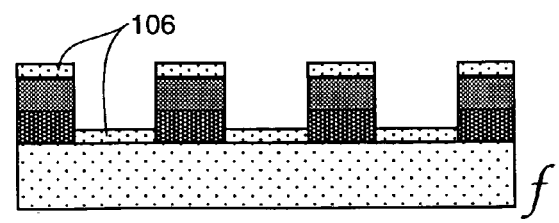

Using an I-line stepper or contact lithography system, expose the coated wafer substrate 100 to an appropriate RF Metal mask and develop the S-1813 resist 104 using a diluted sodium hydroxide based developer such as Shipley Microposit 351 developer, FIGS. 1G and 1H.

Expose the patterned wafer substrate 100 to Deep Ultra Violet (DUV) light and develop the SF-11 resist 102 using a tetraethylammonium hydroxide solution such as Micro Chem Corp. Nano-PMGI 101 developer, FIGS. 1I and 1J.

Coat the wafer substrate 100 with evaporated metal such as titanium/gold (TiAu), 200 Å Ti/3000 Å Au 106. The titanium is used as an adhesion layer and could be replaced with chromium (Cr), FIGS. 1K and 1L. The gold is used as the conduction layer.

Figure 1M:
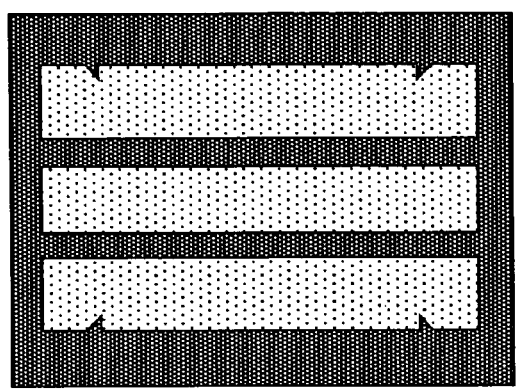
Figure 1N:
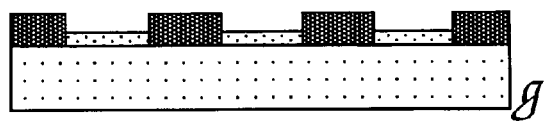

Lift-off the excess metal using tape and dissolve the S-1813 resist 104 using acetone, followed by an isopropyl alcohol rinse and De-Ionized (DI) water rinse, FIGS. 1M and 1N. The DI water rinse is desirable to minimize cracking of the PMGI photoresist 102.

Figure 1O:
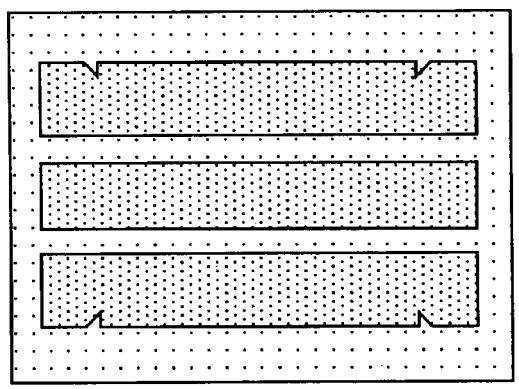
Figure 1P:
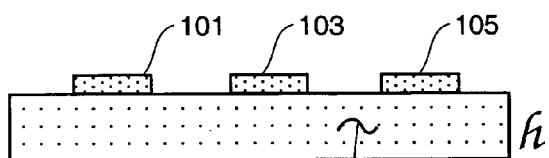

Strip the SF-11 photo resist 102 using a hot (90° C.) 1-methyl-2-pyrrolidinone stripper such as Shipley 1165 remover, followed by a De-Ionized (DI) water rinse and nitrogen dry, FIGS. 1O and 1P. For thicker metal, omit the SF-11 strip to achieve the thick metal planarization described in the initial sentences of the RF Metal process. The completed RF metal step is shown in FIG. 1O and FIG. 1P and includes the isolated conductors 101, 103 and 105.

RF Dielectric Process

The RF dielectric defines the capacitance of the switch in the "closed"-state. Processing steps involving the RF dielectric appear in the FIG. 2 drawings including the steps shown in FIG. 2A through FIG. 2P.

Figure 2A:
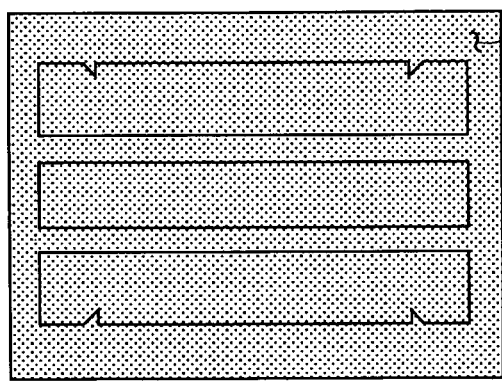
FIG. 2 in the drawings includes the views of FIG. 2A through FIG. 2P and shows a radio frequency dielectric fabrication sequence for a MEMS switch according to the present invention.
Figure 2B:
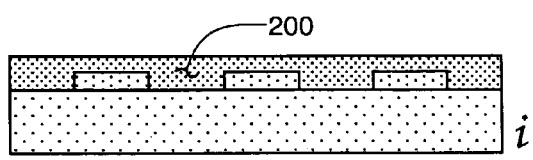

Coat the FIG. 1O and FIG. 1P metallized wafer 100 with a thin dielectric material such as 2000 Å alumina $Al_2O_3$ 200 using RF sputtering, FIG. 2A and FIG. 2B. Alternative dielectrics include silicon nitride $Si_3N_4$ and silicon dioxide $SiO_2$.

Figure 2C:
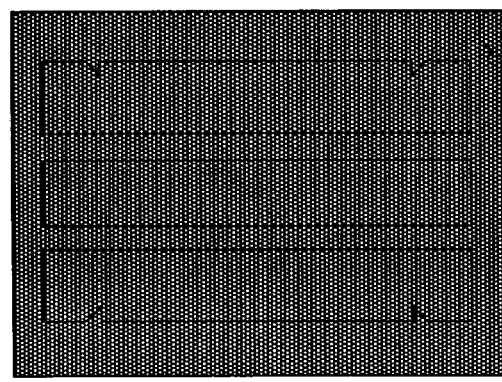
Figure 2D:
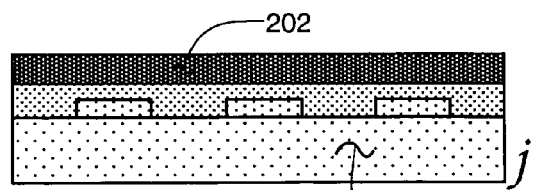

Spin coat the wafer with one coat PMGI photoresist (SF-11) 202, cure at 270° C., FIG. 2C and FIG. 2D. This step is also omitted for the thick metal planarization option.

Figure 2E:
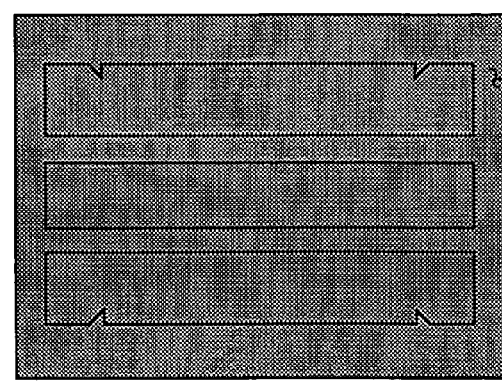
Figure 2F:
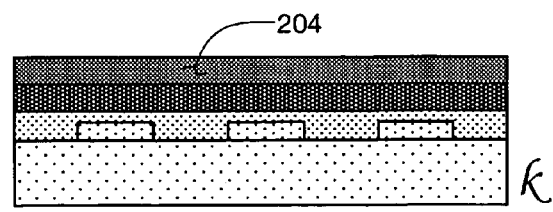

Spin coat the wafer with one coat of positive photoresist (S-1813) 204, cure at 110° C., FIG. 2E and FIG. 2F.

Figure 2G:
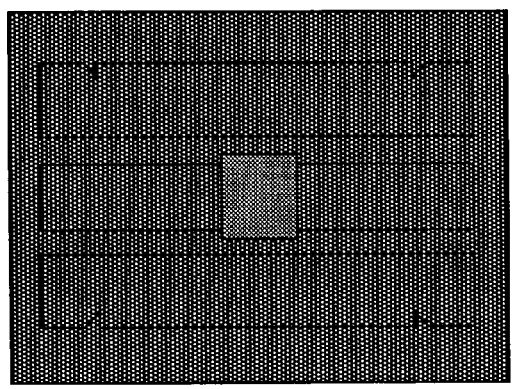
Figure 2H:
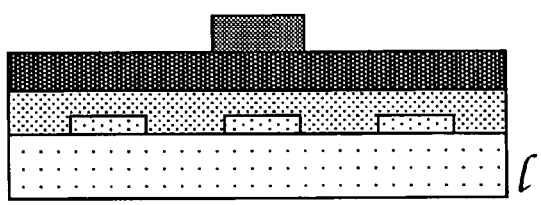

Using an I-line stepper or contact lithography system, expose the coated wafer to an appropriate RF Dielectric mask and develop the S-1813 resist 204 using a diluted developer (351:DI), FIG. 2G and FIG. 2H.

Figure 2I:
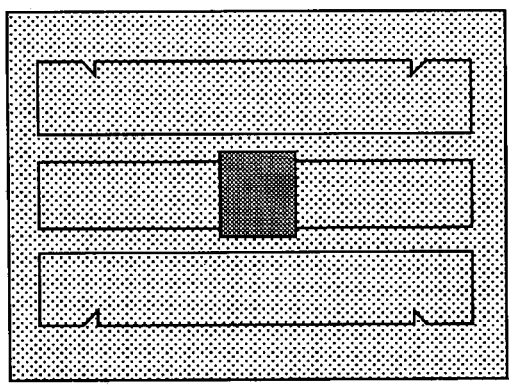
Figure 2J:
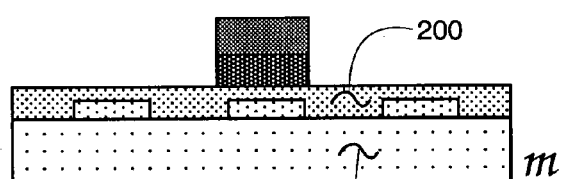

Expose the patterned wafer to deep ultraviolet light and develop the SF-11 resist 202 using Nano-101 developer, FIG. 2I and FIG. 2J.

Figure 2K:
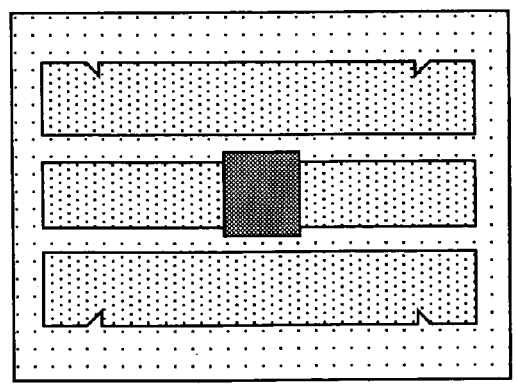
Figure 2L:
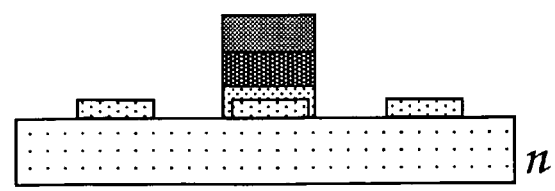

Etch the exposed thin-film dielectric film 200 using a dry or wet chemical etch, FIGS. 2K and 2L.

Figure 2M:
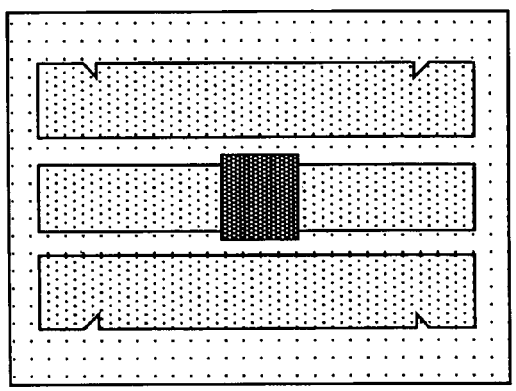
Figure 2N:
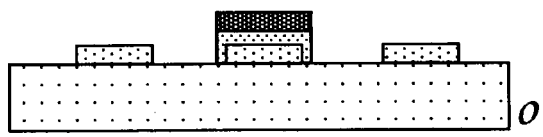

Strip the S-1813 resist 204 using an acetone rinse followed by an isopropyl alcohol and DI water rinse FIGS. 2M and 2N.

Figure 2O:
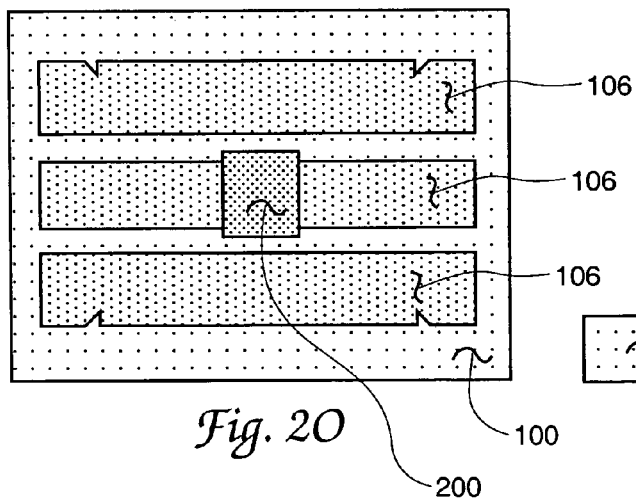
Figure 2P:
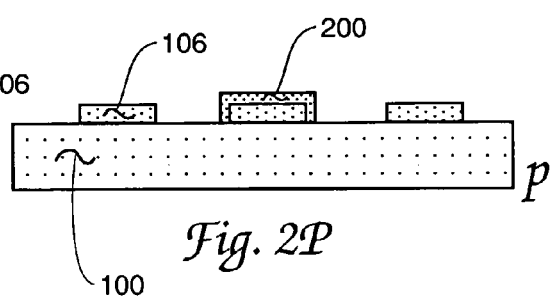

Strip the SF-11 resist 202 using hot (90° C.) 1165 remover, FIGS. 2O and 2P. For thick RF metal, delete this step to maintain planarization. The completed RF dielectric sequence is shown in the top and side views of FIG. 2O and FIG. 2P.

Sacrificial Layer Process

In the present invention a sacrificial post determines the gap height of the switch and its capacitance in the movable member-up-state. To explain in more detail, fabrication of a MEMS switch (i.e., having a bridge or cantilever beam) requires a sacrificial layer to support the suspended portion of the beam during processing. This sacrificial layer is herein referred-to as the post layer. The completed post is shown as layer 312 in FIG. 3K and FIG. 3L. Post height is determined by the thickness of the photoresist used during post formation. Spinning the photoresist at a slow speed results in a thicker film and a thinner film at higher speed. The achieved switch gap spacing can be varied from 1 to 5 micrometers with this process Spin coat the wafer with one coat of PMGI photoresist (SF-11), FIG. 3A, cure at 270° C. Repeat this process for three total coats of resist 300, 302 and 304 in FIG. 3B to form a three-micron stack thickness. The PMGI coats determine the gap height of the switches. SF-11 PMGI photoresist provides about 1.0 µm of thickness per layer. For thicker gap spacings, PMGI SF-19 resist could be used to achieve a 5.0 µm thickness per layer.

Figure 3A:
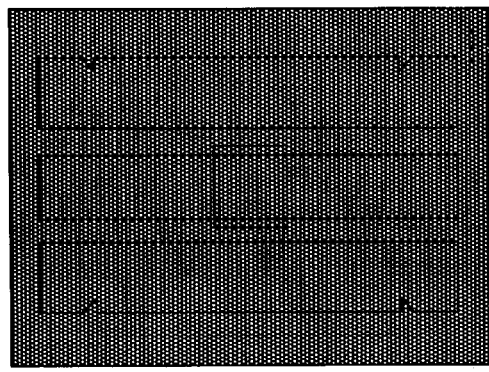
FIG. 3 in the drawings includes the views of FIG. 3A through FIG. 3L and shows a switch sacrificial layer metal fabrication sequence for a MEMS switch according to the present invention.
Figure 3B:
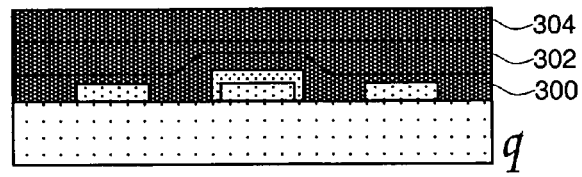
Figure 3C:
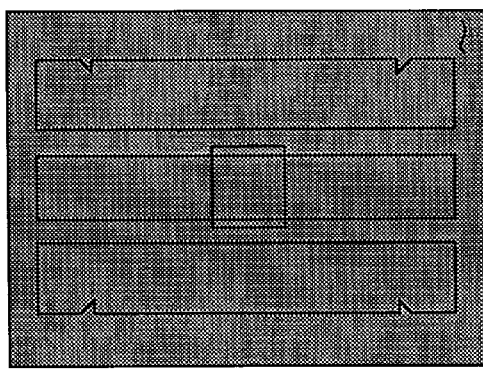
Figure 3D:
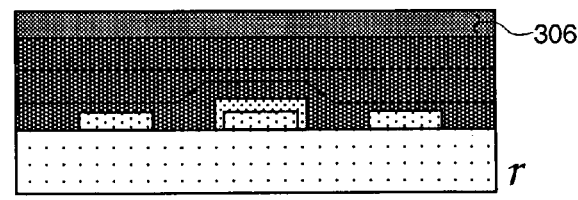

Spin coat the wafer with one coat of positive photoresist (S-1813), 306 in FIG. 3C and FIG. 3D, cure at 110° C.

Figure 3E:
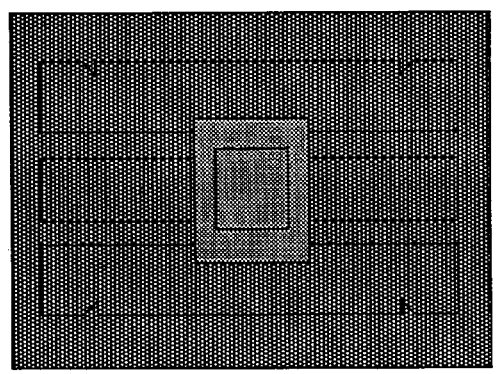
Figure 3F:
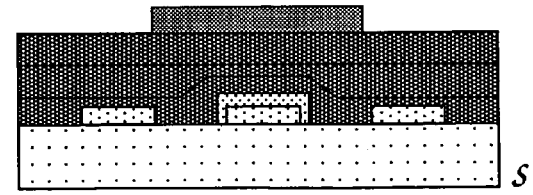

Using an I-line stepper or a contact lithography system, expose the coated wafer to the Sacrificial Layer mask and develop the S-1813 resist 306 using a diluted developer (351:DI), FIG. 3E and FIG. 3F.

Figure 3G:
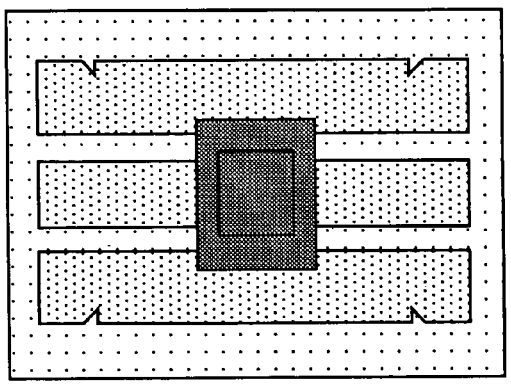
Figure 3H:
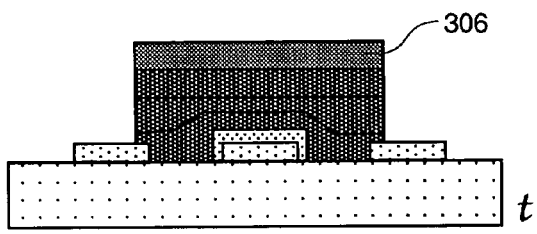

Expose the PMGI (SF-11) resist 300, 302 and 304 to deep ultraviolet light and develop the SF-11 resist 300, 302 and 304 using Nano-PMGI-101 developer, FIG. 3G and FIG. 3H.

Figure 3I:
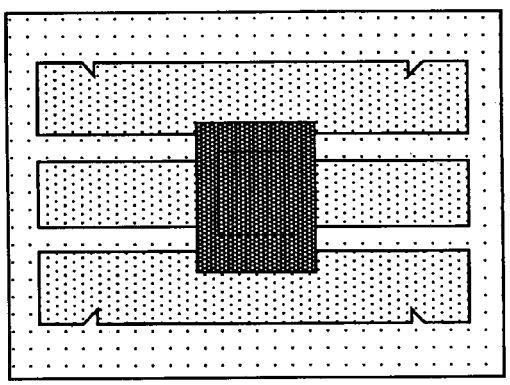
Figure 3J:
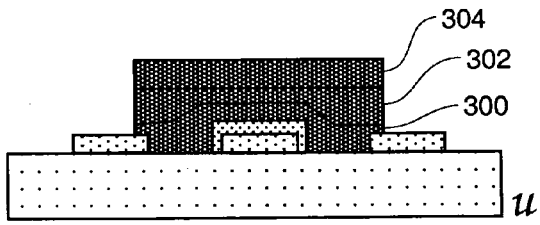

Strip the S-1813 resist 306 using acetone followed by an isopropyl alcohol rinse and a DI water rinse; FIG. 3I and FIG. 3J. The DI water rinse is desirable to minimize cracking of the PMGI photoresist 304.

Reflow the PMGI coating layers 300, 302 and 304 in a 250° C. hot air oven. The reflow step achieves a uniform sloped sidewall, 310 in FIG. 3L, for the layers 300, 302 and 304 to ensure continuous metal coverage in the Bridge Metal process. The completed sacrificial layer process is shown in FIG. 3K and FIG. 3L where the photoresist layers 300, 302 and 304 appear in merged condition at 312.

Bridge Metal Process

Bridge metal defines the top, movable portion of the present invention switch. The careful choice of bridge metallization minimizes curling of the switch. (See for example K. Leedy, et al, "Metallization Schemes for RF MEMS Switches", J. Vacuum Science Technology A 21(4) July/August 2003, pp. 1172-1177.)

Figure 3K:
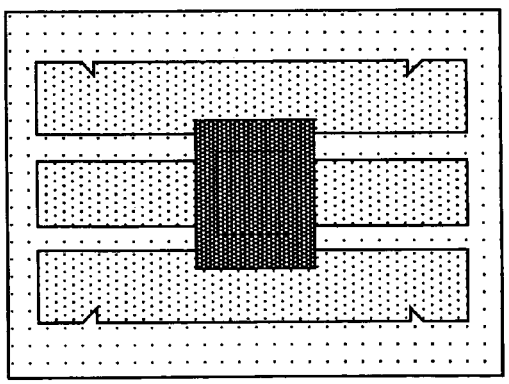
Figure 3L:
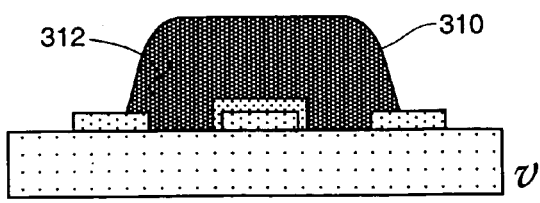

Spin coat the FIG. 3K and FIG. 3L wafer with one coat of a PMGI Lift-Off Resist such as Micro Chem. Corp. LOR-10 photoresist 400, cure at 170° C. The resist chosen for this step should not interact with the existing PMGI sacrificial post resist at 312. The cure temperature should also be lower that the 250° C. reflow temperature of the previous FIG. 3K and FIG. 3L step.

Figure 4A:
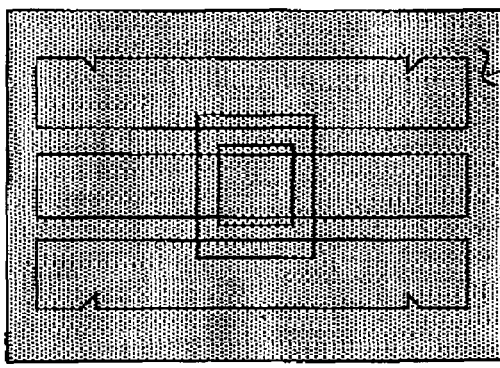
FIG. 4 in the drawings includes the views of FIG. 4A through FIG. 4L and shows a bridge metal fabrication sequence for a MEMS switch according to the present invention.
Figure 4B:
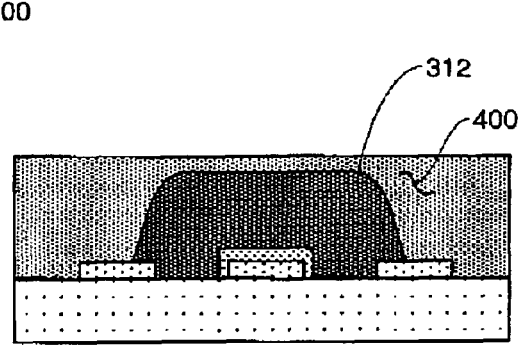
Figure 4C:
Figure 4D:
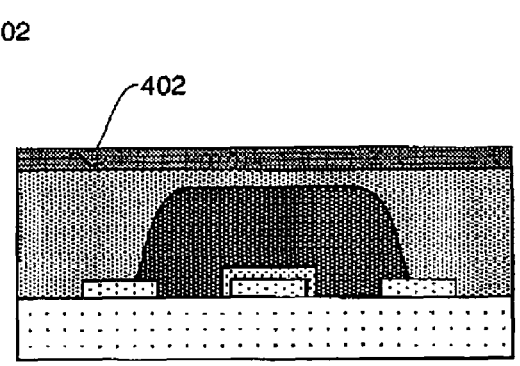

Spin coat the wafer with one coat of a positive resist (S-1813) 402, cure at 110° C., FIG. 4C and FIG. 4D.

Figure 4E:
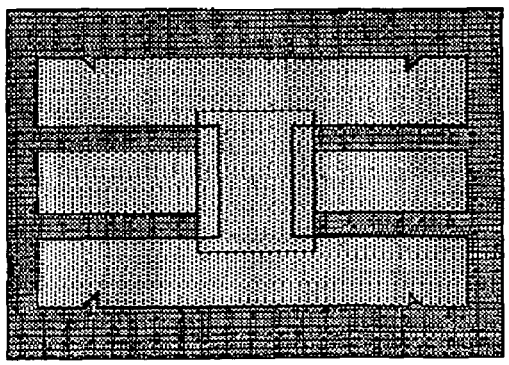
Figure 4F:
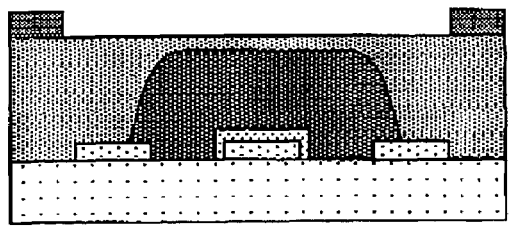
Figure 4G:
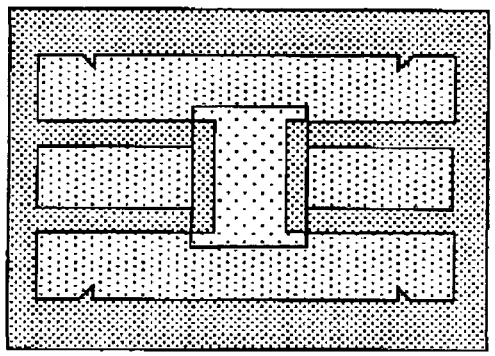
Figure 4H:
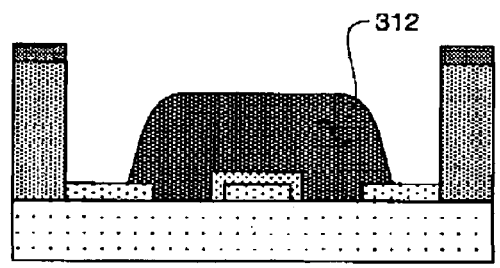
Figure 4I:
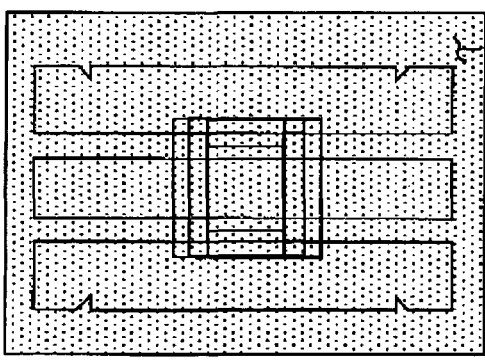
Figure 4J:
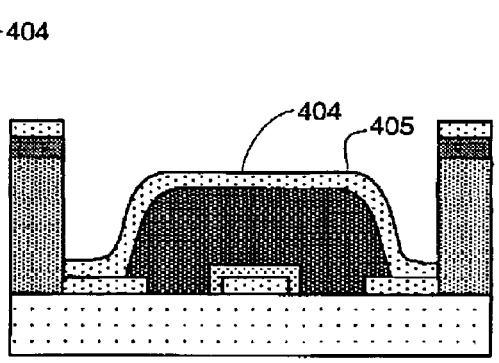

Using an I-line stepper or a contact lithography system, expose the coated wafer to the Bridge Metal mask and develop the S-1813 resist 402 using a diluted developer (351:DI), FIG. 4E and FIG. 4F.

Develop the LOR-10 photoresist 400 using a tetramethylammonium hydroxide developer such as Shipley Microposit developer LDD-26W. This developer should not interact with the existing PMGI sacrificial post resist 312, FIG. 4G and FIG. 4H.

Aa. Coat the patterned wafer with a thin metal film such as 7000 Å of evaporated Au 404 in FIG. 4I and FIG. 4J. Notably this step uses gold that adheres to the exposed gold of the RF metal process without requiring an adhesion layer. Such an adhesion layer may produce a stress gradient within the film resulting in curling of the switch being fabricated. A thin adhesion layer (of Ti or Cr) may be used on the bridge metal top surface to promote cap adhesion.

Figure 4K:
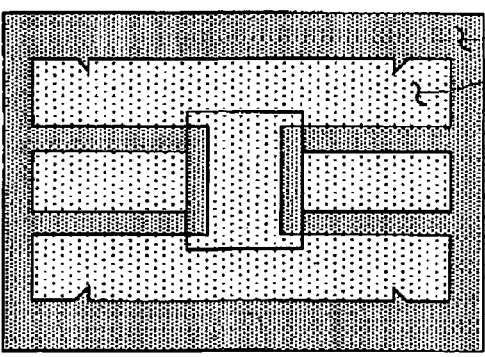
Figure 4L:
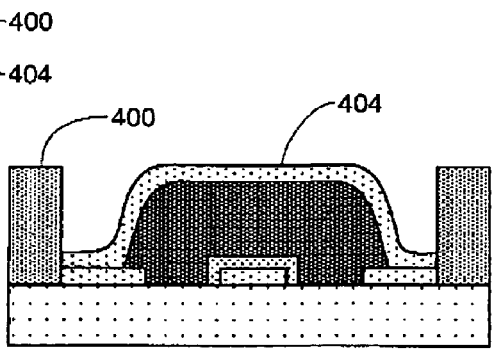

Ab. Lift-off the excess metal using tape and remove the S-1813 resist 402 using acetone, followed by an isopropyl alcohol rinse and a DI water rinse. The completed Bridge Metal step is shown in FIG. 4K and FIG. 4L.

Cap Sacrificial Layer Process

The cap sacrificial layer defines the region to be covered by the encapsulating shell. The thickness of the sacrificial layer determines the inner shell height over the switch. This process covers the captive switch and should not compromise the existing structures.

The ability to stack sacrificial layer materials such as photoresist on the FIG. 4 metal 404 of the movable switch element without causing harmful distortion to the metal 404 is in fact believed to be a notable aspect of the present invention. Often it is found that the curing of newly stacked organic materials is so permanently disruptive to an underlying metal layer or an underlying oxide layer as to preclude such procedures. The materials, sub layer thickness measurements, temperatures and other details recited for the FIG. 5 sequence are therefore of special interest with respect to the present invention. Although this FIG. 5 sequence accomplishes the addition of a second sacrificial layer on top of a first sacrificial layer and its exposed metal, it is believed the disclosed sequence is applicable to the fabrication of more than two such layers as accomplished herein and can be extended to three or more layers without significant difficulty where needed.

Ac. Spin coat the FIG. 4K and FIG. 4L wafer with one coat of PMGI photoresist (SF-11), cure at 200° C. Repeat this step for three total coats of resist 500, 502 and 504 as appear in FIG. 5B. Three coats of SF-11 resist provide 3.0 µm gap spacing. This is the same PMGI photoresist used for the switch gap spacing 312 and should be cured at the indicated lower temperature to minimize impact on the existing films. PMGI SF-19 photoresist could be used for thicker gap spacing.

Ad. Spin-coat the wafer with one coat of positive photoresist (S-1813) 506, cure at 110° C., FIG. 5C and FIG. 5D.

Ae. Using an I-line stepper or contact lithography system, expose the coated wafer to the Cap Sacrificial mask and develop the S-1813 resist 506 using diluted developer (351:DI), FIG. 5E and FIG. 5F.

Af. Expose the PMGI SF-11 resist 500, 502 and 504 to deep ultraviolet light and develop the SF-11 resist 500, 502 and 504 using Nano-101 developer, FIG. 5G and FIG. 5H.

Ag. Strip the S-1813 resist 506 using acetone followed by an isopropyl alcohol rinse and DI water rinse, FIG. 5I and FIG. 5J.

Ah. Strip the remaining lift-off resist (LOR-10) 400 using a tetramethylammonium hydroxide developer such as Shipley Microposit developer LDD-26W, followed by a DI water rinse and nitrogen dry, FIG. 5K and FIG. 5L.

Figure 5G:
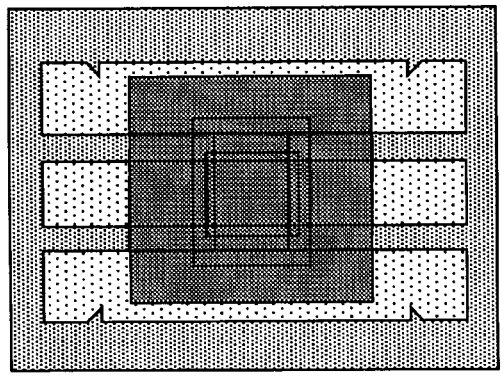
FIG. 5 in the drawings includes the views of FIG. 5A through FIG. 5N and shows a cap sacrificial layer process for a MEMS switch according to the present invention.
Figure 5H:
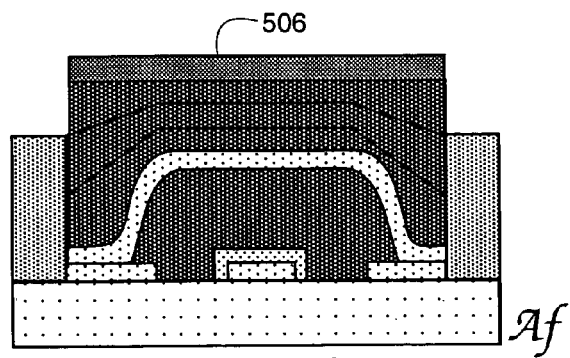
Figure 5I:
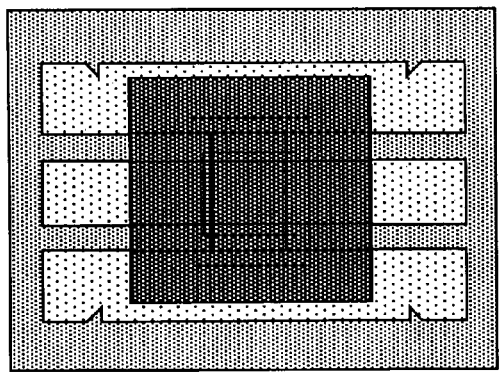
Figure 5J:
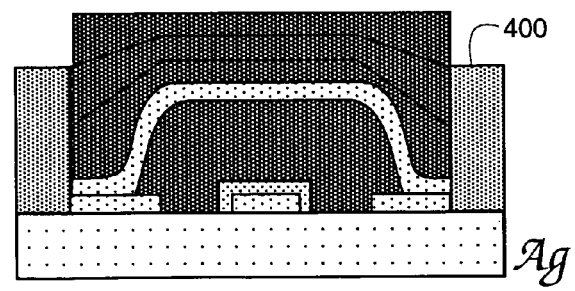
Figure 5K:
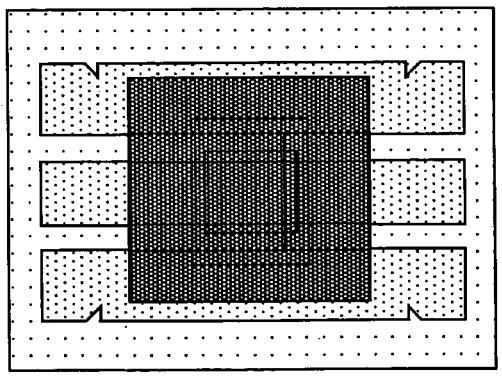
Figure 5L:
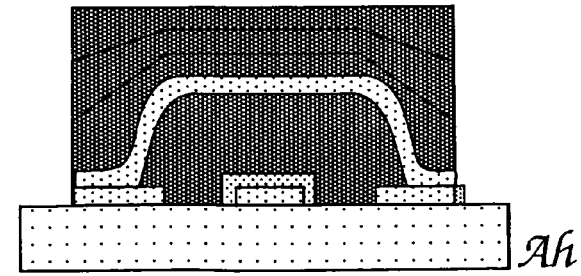
Figure 5M:
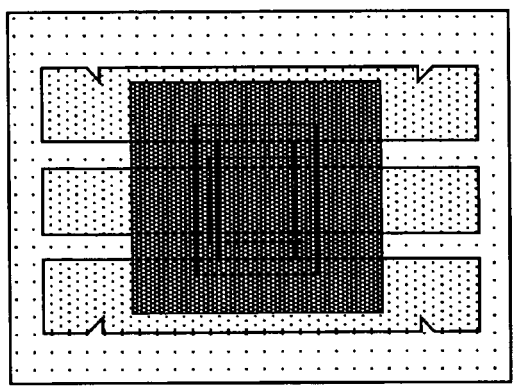
Figure 5N:
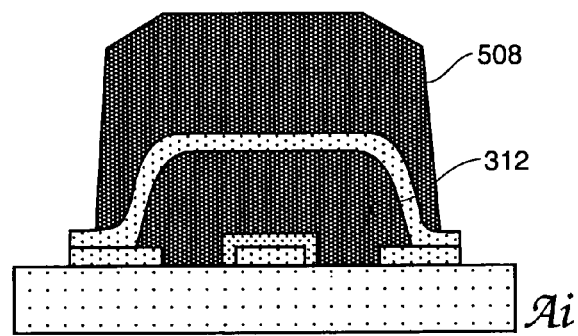

Ai. Reflow the PMGI coated wafer in a 250° C. hot air oven. This reflow provides a uniform sloped sidewall 508 required for the capping layer step coverage. The reflow process should not exceed 250° C. to minimize impact on the existing PMGI films 312. The exposure time for this reflow temperature is preferably made somewhat short in the interest of damage avoidance to the underlying layers of a device; exposure times in the range of 60 to 300 seconds are thus found to be practical. No adverse impacts on the existing films have been observed. The completed second sacrificial layer step is shown in FIG. 5M and FIG. 5N.

Capping Layer Process

Figure 11:
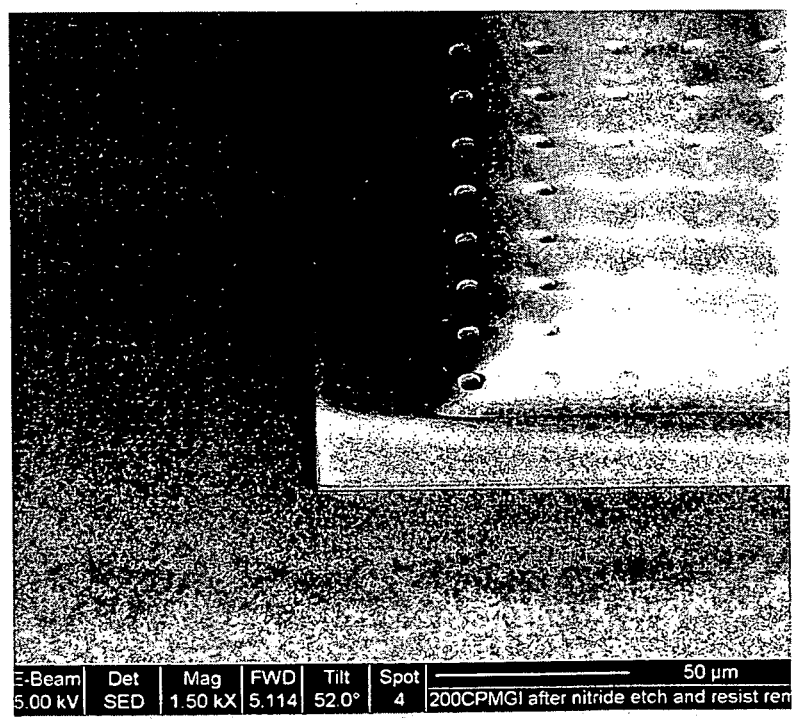
FIG. 11 in the drawings shows a MEMS switch dielectric shell member according to the present invention.

The capping layer defines the dielectric shell that will enclose the RF MEMS switch. This step also defines access holes or tunnels within the dielectric shell allowing for removal of the sacrificial layer photoresist of the shell and the switch. Access holes are shown in FIG. 11 of the drawings. Access tunnels are shown in the FIG. 14 and FIG. 15 drawings. Although a combination of access holes and access tunnels may be used in the invention one or the other of these communication paths from outside to inside of the dielectric enclosure is believed a satisfactory arrangement. Because of the larger aperture dimensions involved, the resulting improved flow of reactant materials achieved and the difficulty in fabricating the small holes shown in, for example, FIG. 12 and FIG. 13 we have found the use of tunnels to be the most desirable arrangement.

Aj. Coat the FIG. 5M and FIG. 5N wafer with a thin adhesion layer 600 composed of 0.01 μm oxygen rich sputtered alumina $Al_2O_3$, followed by a thick dielectric film, of nominally 1.67 μm sputtered silicon nitride $Si_3N_4$ 602, FIG. 6A and FIG. 6B. The alumina layer provides adhesion of the silicon nitride cap 602 to the gold and sapphire substrate surfaces at 604 and 605. Films deposited by PECVD at low temperatures (below 200° C.) could also be used. Possible alternative dielectric films at 602 also include alumina $Al_2O_3$.

The sputtered silicon nitride used in the cap at 602 has undergone extensive deposition development. Silicon nitride thin films may be fabricated by reactive RF sputtering using a 99.999% pure Si target with a Denton Vacuum Discovery-18 type of magnetron sputtering system and a base vacuum of $5 \times 10^{-6}$ Pa. A mass flow regulated $Ar-N_2$ sputtering pressure of 0.53 Pa and 400 watts of forward power result in a nominal deposition rate of 0.13 nm/s. The $N_2$ partial flow rate (the ratio of the nitrogen flow rate to the total flow rate of nitrogen and argon) is 50%. Deposited films for the shell cap at 602 are 1670 nm thick and have an intrinsic compressive stress of 102 MPa.

Ak. Spin coat the dielectric coated wafer with one coat of positive photoresist (S-1818) 606, cure at 110° C., FIG. 6C and FIG. 6D. A thick photoresist 606 is necessary to serve as an etch mask for the cap layer dielectric. S-1818 photoresist provides about 1.8 μm of film thickness per coat.

Al. Using an I-line stepper or contact lithography system, expose the coated wafer to the Capping Layer mask and develop the S-1818 resist 606 using a diluted developer (351:DI), FIG. 6E and FIG. 6F. Access holes 804 (in FIG. 8B) and access tunnels 608 and 610 are also defined in this lithography step.

Am. Etch the exposed thick film dielectric at 602 using a dry or wet chemical etch, FIG. 6G and FIG. 6H. Visual examination should ensure the access holes or tunnels 608 and 610 are cleared to allow complete removal of the PMGI sacrificial resists at 508 and 312.

An. Strip the S-1818 resist 606 using acetone followed by an isopropyl alcohol rinse and a DI water rinse, FIG. 6I and FIG. 6J.

Ao. Strip all the remaining PMGI SF-11 photoresist 508 and 312 using a hot (90° C.) 1165 stripper, FIG. 6K and FIG. 6L.

Figure 6A:
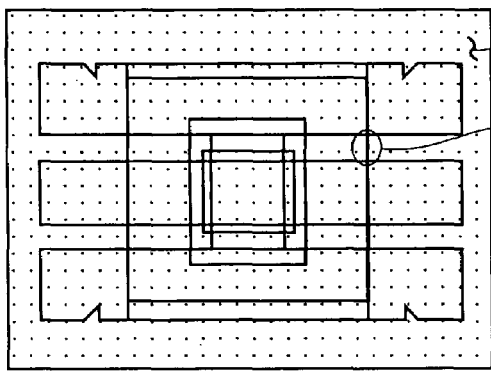
FIG. 6 in the drawings includes the views of FIG. 6A through FIG. 6L and shows a capping layer fabrication sequence for a MEMS switch according to the present invention.
Figure 6B:
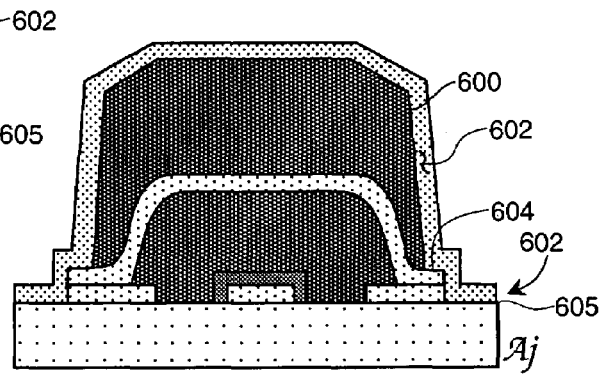
Figure 6C:
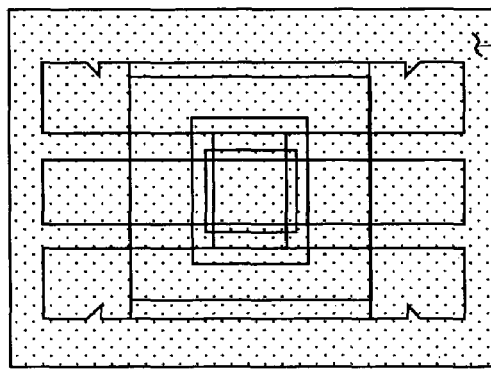
Figure 6D:
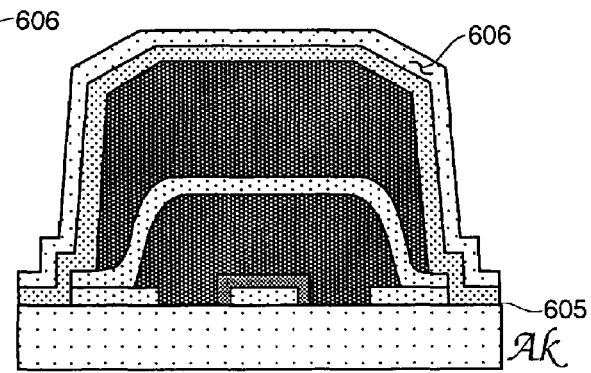
Figure 6E:
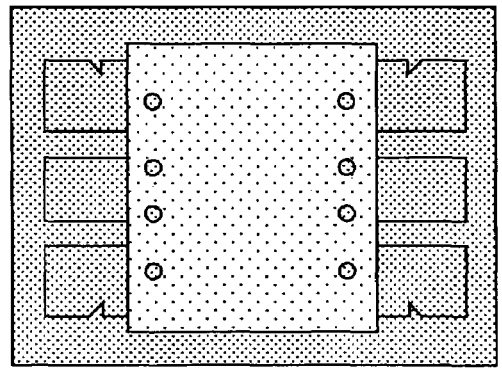
Figure 6F:
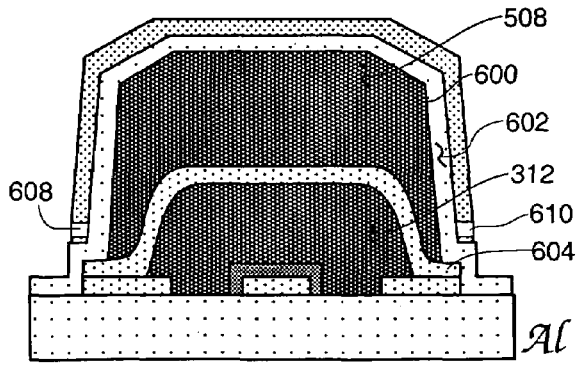
Figure 6G:
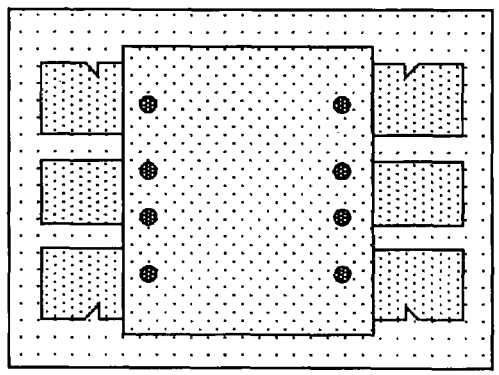
Figure 6H:
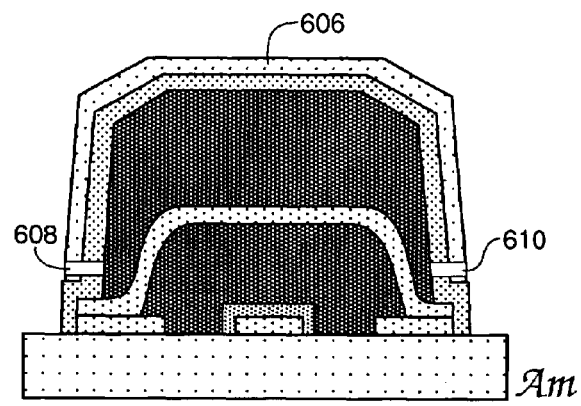
Figure 6I:
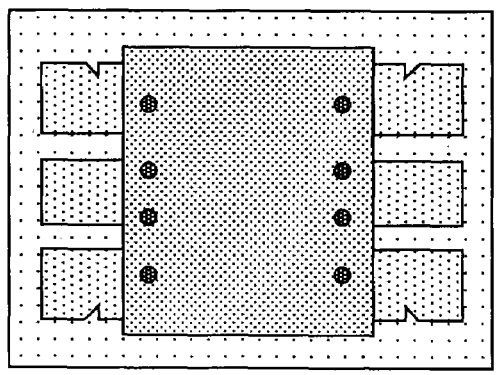
Figure 6J:
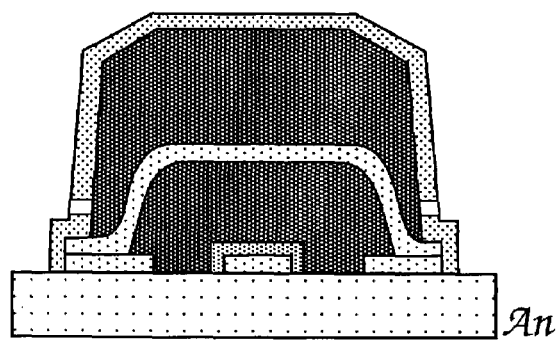
Figure 6K:
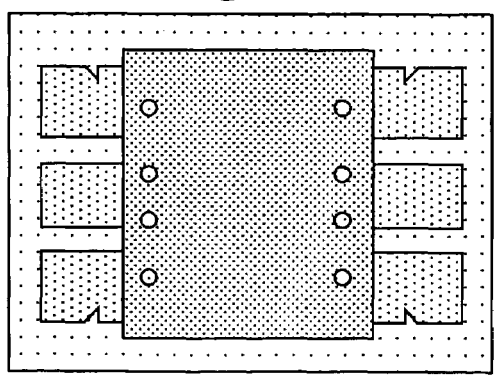
Figure 6L:
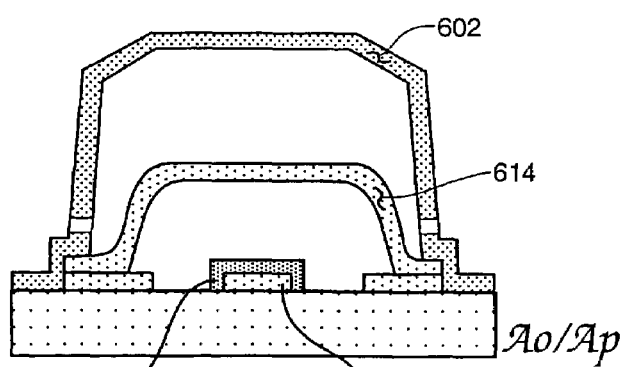

Ap. Immediately rinse the wafer in a submersion bath of isopropyl alcohol. Repeat the isopropyl alcohol bath step 3-4 times. Rinse the wafer in a bath of methanol. Repeat the methanol bath rinse step 3-4 times. Complete the release step by using a carbon dioxide critical point dry. The completed Capping Layer step with released RF MEMS switch is shown in FIG. 6K and FIG. 6L.

Figure 14:
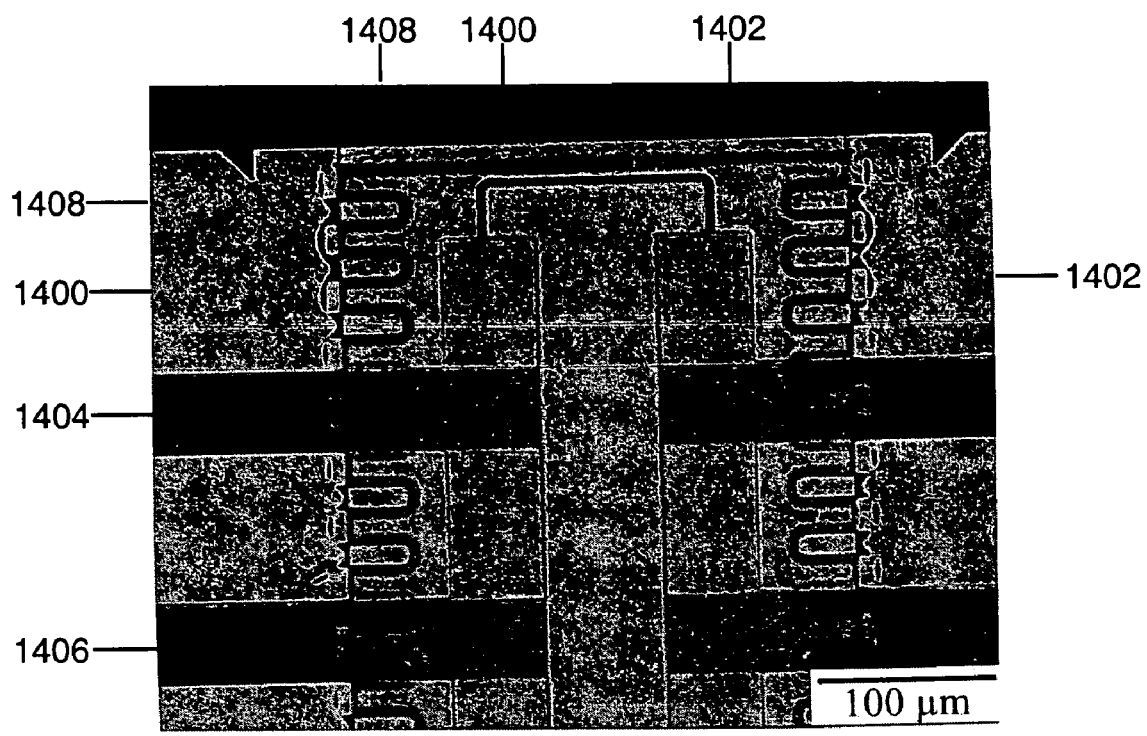
FIG. 14 in the drawings shows an interior view of an enclosed and released from captivity switch according to the invention.
Figure 15:
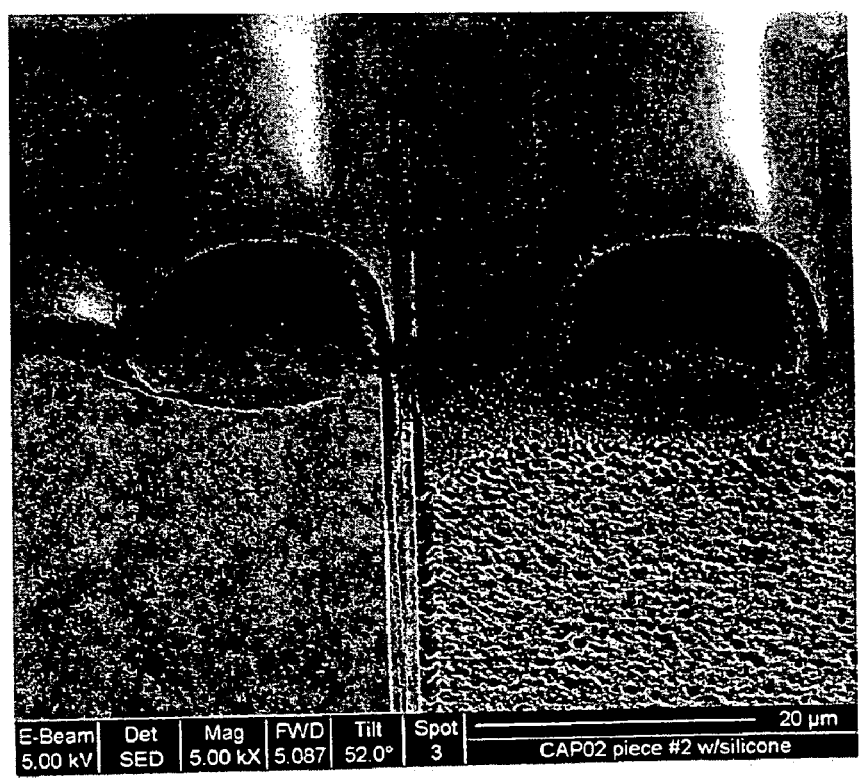
FIG. 15 in the drawings shows tunnel structure usable with the enclosure of the present invention.

Although not expressly shown in the drawings the access tunnels of FIG. 14 and FIG. 15 in the drawings are preferably formed during the FIG. 6 sequence. This may be accomplished by providing the capping layer mask with combination tooth-like extensions at its periphery followed by covering these extensions and removal of the mask material.

PECVD Sealing Process

The Plasma Enhanced Chemical Vapor Deposition (PECVD) process may be used to seal the access holes and tunnels of the encapsulation shell.

Aq. Bake out the FIG. 6K and FIG. 6L encapsulated wafers in a 90° C., nitrogen oven for 1 hour. Coat the wafer with a thin adhesion layer composed of 0.01 micrometer of oxygen rich sputtered alumina, $Al_2O_3$, followed by a thick film of PECVD silicon oxide, nominally 2 μm, 700 in FIG. 7A and FIG. 7B. PECVD $SiO_2$ is deposited at 270 degrees Centigrade and 900 millitorrs of pressure. Since such PECVD plugs the access tunnels or access holes the PECVD $SiO_2$ is not observed to deposit within the encapsulated shell. As an alternative, PECVD silicon nitride may also be used.

Ar. Spin coat the wafer with one coat of positive photoresist (S-1818) 702 in FIG. 7C and FIG. 7D, cure at 110° C. A photoresist is necessary to serve as an etch mask for the sealing layer dielectric.

As. Using an I-line stepper or contact lithography system, expose the coated wafer to the Sealing Layer mask and develop the S-1818 resist 702 using a diluted developer (351:DI), FIG. 7E and FIG. 7F.

At. Etch the exposed thick film dielectric at 704 in FIG. 7E and FIG. 7F using a dry or wet chemical etch, FIG. 7G and FIG. 7H.

Figure 7A:
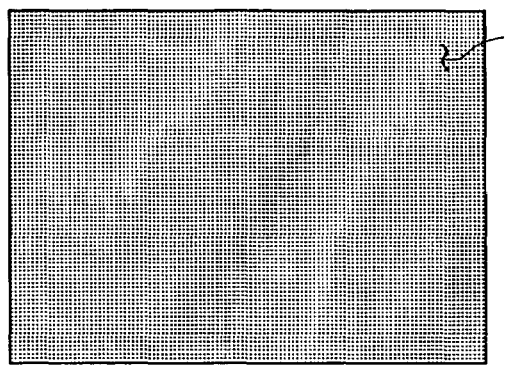
FIG. 7 in the drawings includes the views of FIG. 7A through FIG. 7J and shows a PECVD sealing sequence for the hole and tunnel interior to exterior communication paths of a MEMS switch according to the present invention.
Figure 7B:
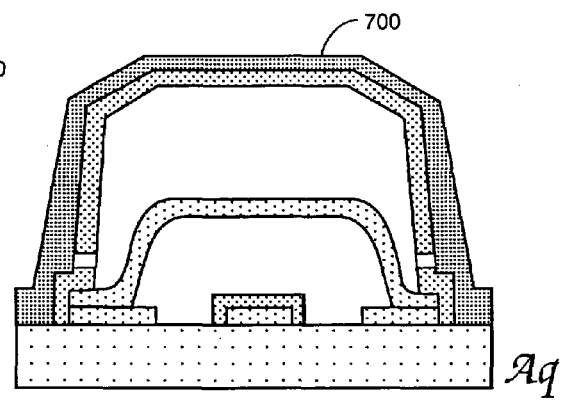
Figure 7C:
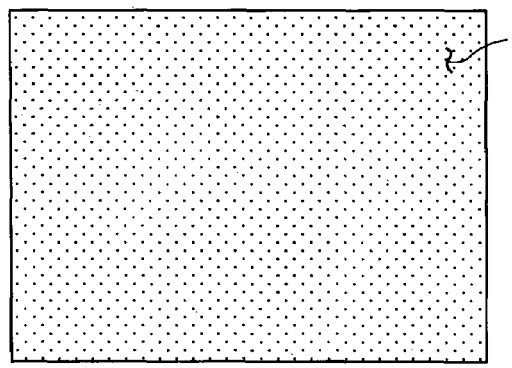
Figure 7D:
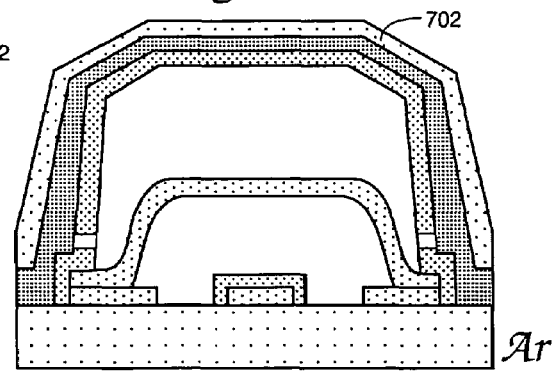
Figure 7E:
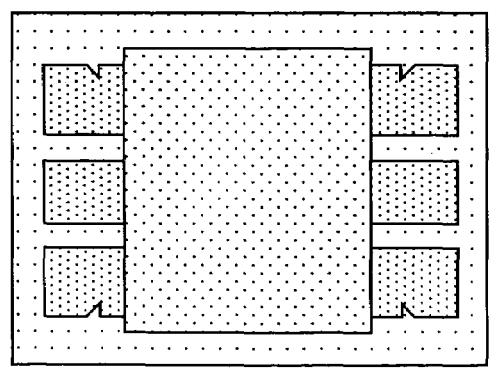
Figure 7F:
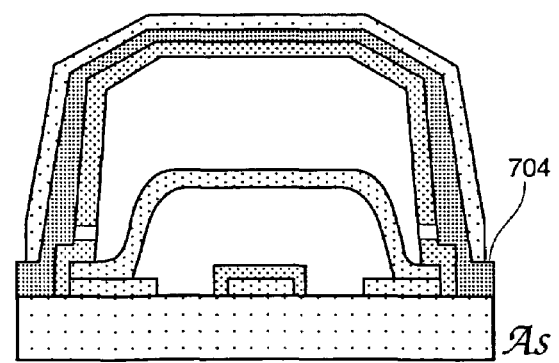
Figure 7G:
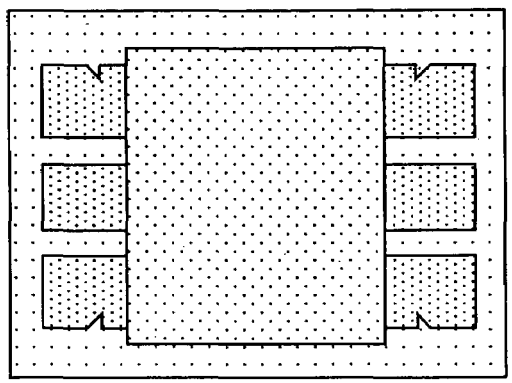
Figure 7H:
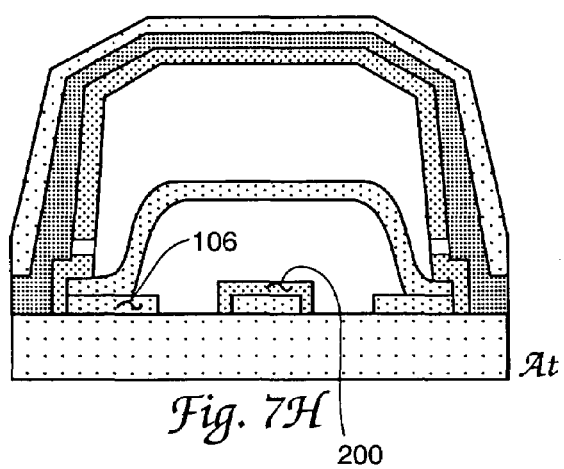
Figure 7I:
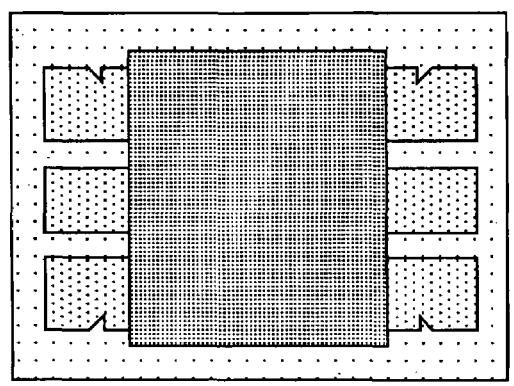
Figure 7J:
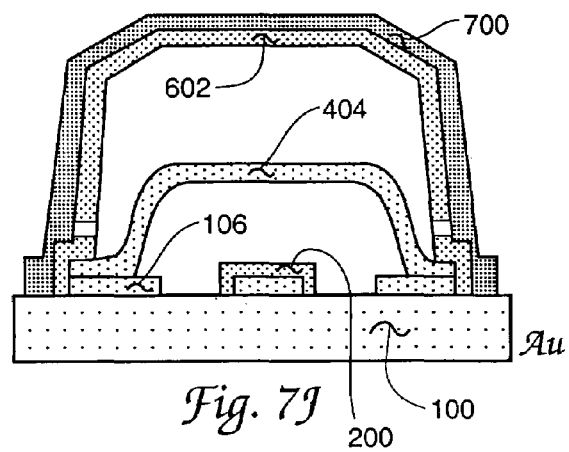

Au. Strip the S-1818 resist 702 using acetone followed by an isopropyl alcohol rinse and a DI water rinse, FIG. 7I and FIG. 7J. The completed PECVD sealed switches are shown in FIG. 7I and FIG. 7J.

Spin-on-Glass Sealing Process

The spin-on-glass process may also be used to seal the access holes in the encapsulation shell. The low viscosity of the spin-on-glass minimizes penetration into the access holes or tunnels. (See for example H. Elderstig and P. Wallgren; "Spin deposition of polymers over holes and cavities", Sensors and Actuators A 46-46, 1995, pg. 95-97.)

Av. Spin coat the FIG. 6K and FIG. 6L wafer with a spin-on-glass film 800 such as 3 micrometers of Honeywell Accuflo-3025, cure the film at 160° C., 200° C., and 240° C., FIG. 8A and FIG. 8B. A three-step sequential cure cycle using progressively higher temperatures is desirable to completely cure this type of spin-on glass. A single layer is formed. The cap holes are formed in step Al in FIG. 6E and FIG. 6F; they should be at the sides (608 and 610) or can be on top as shown.

Aw. Spin coat the wafer with a thick positive photoresist, 802 in FIG. 8C and FIG. 8D, such as Hoechst Celanese Corp. AZ-9260 resist, cure at 110° C. This photoresist will serve as an etch mask for the spin-on-glass. This resist provides a 5-6 μm film thickness.

Ax. Using an I-line stepper or contact lithography system, expose the AZ-9260 resist-coated wafer to the Sealing mask and develop the AZ-9260 photoresist with a diluted potassium hydroxide developer such as Hoechst Celanese Corp. AZ-400K, FIG. 8E and FIG. 8F.

Ay. Etch the patterned spin-on-glass 800 using a dry or wet chemical etch, FIG. 8G and FIG. 8H.

Az. Strip the AZ-9260 photoresist 802 using acetone followed by an isopropyl alcohol rinse. The completed spin-on-glass sealing process is shown in FIG. 8I and FIG. 8J.

Epoxy Sealing Process

This alternate sealing process involves deposition of epoxy droplets onto individual switch caps. For this process, a dam can be fabricated around the switch to contain the epoxy however epoxy sealing without such a dam is also feasible. This process may also be used as an alternative after step An above.

Aaa. For the epoxy sealing process, the sacrificial layers at 312 and 508 are not initially removed.

Aab. Spin coat the wafer with a thick negative photoresist such as MicroChem. Nano SU-8-2007, 900 in FIG. 9C and FIG. 9D, cure at 95° C. This resist provides ~7.0 µm film thickness.

Aac. Using an I-line stepper or contact lithography system, expose the coated wafer to the Sealing Ring mask and develop the Nano SU-8-2007 using an ethyl lactate and diacetone alcohol developer such as MicroChem SU-8 Developer, FIG. 9E and FIG. 9F.

Aad. Strip the remaining PMGI SF-11 photoresist 508 and 312 using 90° C. 1165 stripper. Immediately rinse the wafer in several baths (3-4) of isopropyl alcohol, followed by rinsing in baths of Methanol, and a carbon dioxide critical point dry, FIG. 9G and FIG. 9H.

Figure 9A:
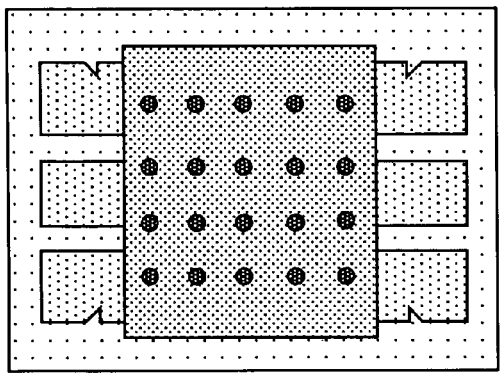
FIG. 9 in the drawings includes the views of FIG. 9A through FIG. 9J and shows an epoxy sealing sequence for the hole and tunnel interior to exterior communication paths of a MEMS switch according to the present invention.
Figure 9B:
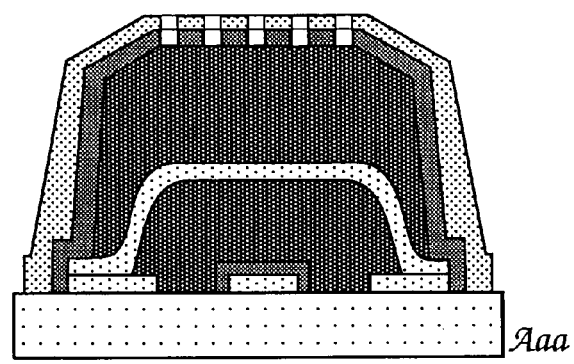
Figure 9C:
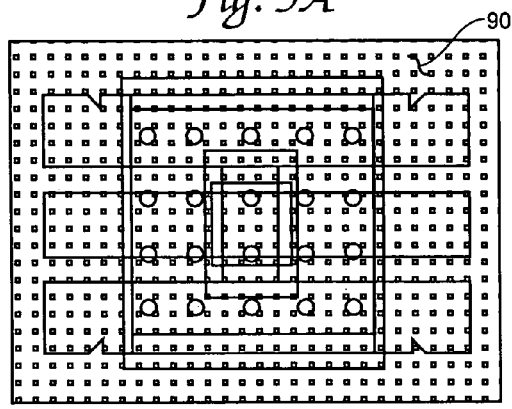
Figure 9D:
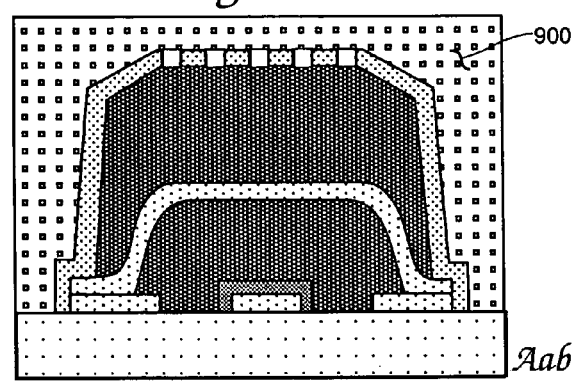
Figure 9E:
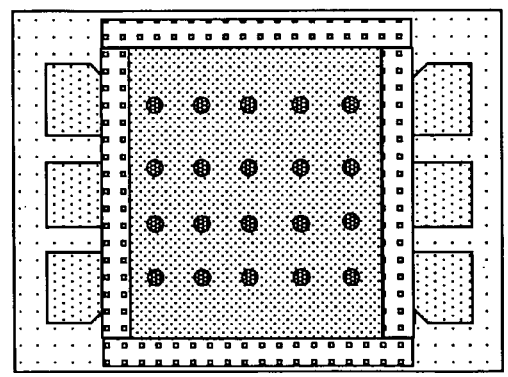
Figure 9F:
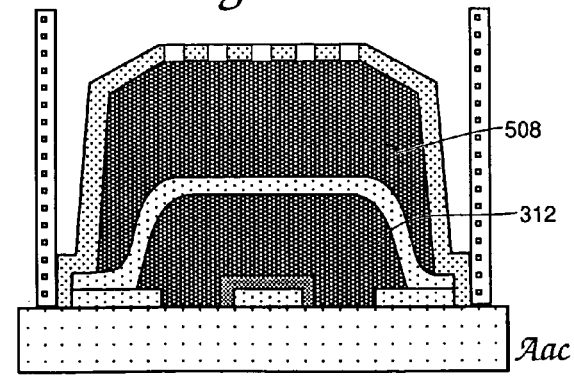
Figure 9G:
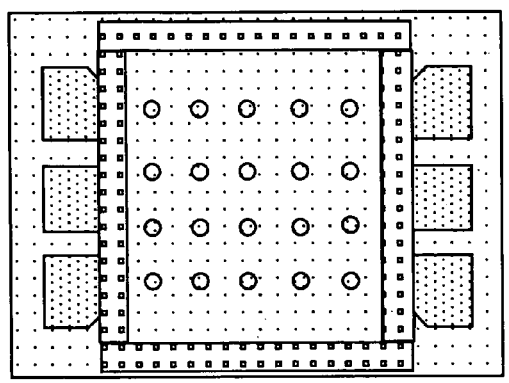
Figure 9H:
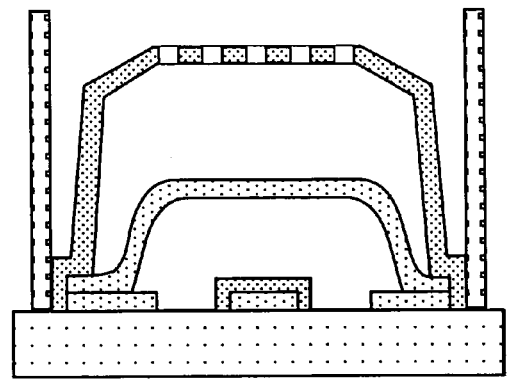
Figure 9I:
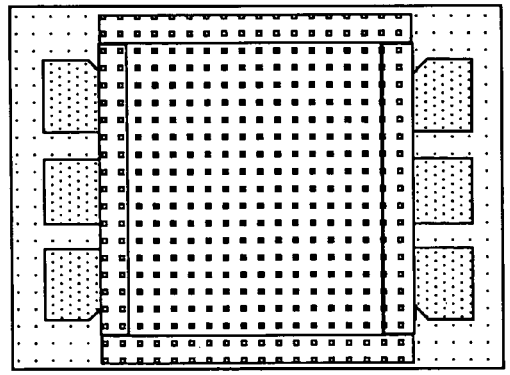
Figure 9J:
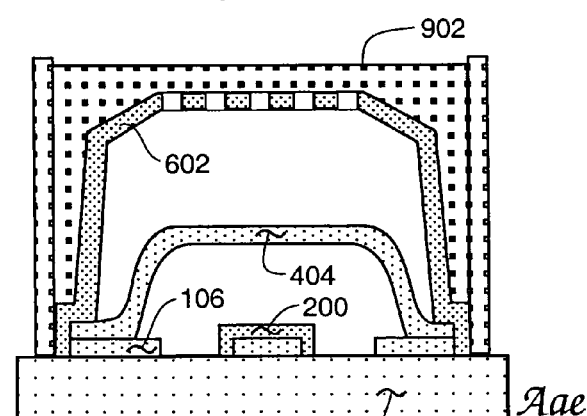

Aae. Coat the switch shells with an epoxy sealant 902 such as OptoCast 3401 or 3410 supplied by Electronics Materials Corp. Cure the epoxy using UV light followed by a 125° C. bake. The completed epoxy sealing process is shown in FIG. 9I and FIG. 9J.

Comparative Discussion

Now that the foregoing formal description of a MEMS capacitance coupled radio frequency switch device and fabrication sequence has been disclosed, it may be helpful to an appreciation of the invention to consider several differences between the disclosed fabrication sequence and the fabricated device in comparison with the more conventional fabrication sequences and devices of similar general nature as are known in the art.

Readers familiar with the MEMS device art will for example appreciate that the device fabricated in the disclosed sequence is of an electrical switch nature as opposed to a transducer or other MEMS device and that such MEMS switches are attended by a somewhat unique collection of characteristics and susceptibilities. First among these characteristics and susceptibilities is a sensitivity to normal semiconductor device fabrication temperatures, temperatures in the 900° C. region for example. Temperatures of this magnitude and even lower (but especially higher temperatures) are found to be destructive to the metal components of a MEMS switch device in that they result in warping or distortion of previously fabricated switch metal components.

In addition to temperature sensitivity it appears significant that the disclosed fabrication sequence enables the use of silicon oxide, silicon nitride and other dielectric materials in the fabrication of the switch device. These especially useful materials are excluded from possible employment in many MEMS devices that are dependent on hydrofluoric acid etching steps in achieving release of a stabilized transducer or other element for example or for other processing steps. A wet hydrofluoric acid etch removal would typically require a water rinse to remove all acid; any water rinse employed can however be catastrophic to a MEMS switch structure. Use of hydrofluoric acid also precludes the use of many dielectrics in the switch and shell including silicon dioxide, $SiO_2$, silicon nitride, $Si_3N_4$ and alumina, $Al_2O_3$; this is especially true for a switch dielectric where precise thickness and integrity should be maintained. Thus in the above disclosed processing sequence a release of switch elements from their bound state by an organic material using an organic solvent rather than an acid, is for example employed.

A notable attribute of the present invention MEMS switch processing is the achieved seamless merging of switch formation, dielectric enclosure and dielectric enclosure sealing operations in a single integrated processing sequence, a sequence performable at the integral wafer level of MEMS fabrication as opposed to during individual die processing. Notably the photoresists and other materials involved in closure of the MEMS package and sealing of the closed package are either the same as those already employed in the fabrication of switch elements or of compatibility with these already employed materials.

Switch Operation

Figure 10:
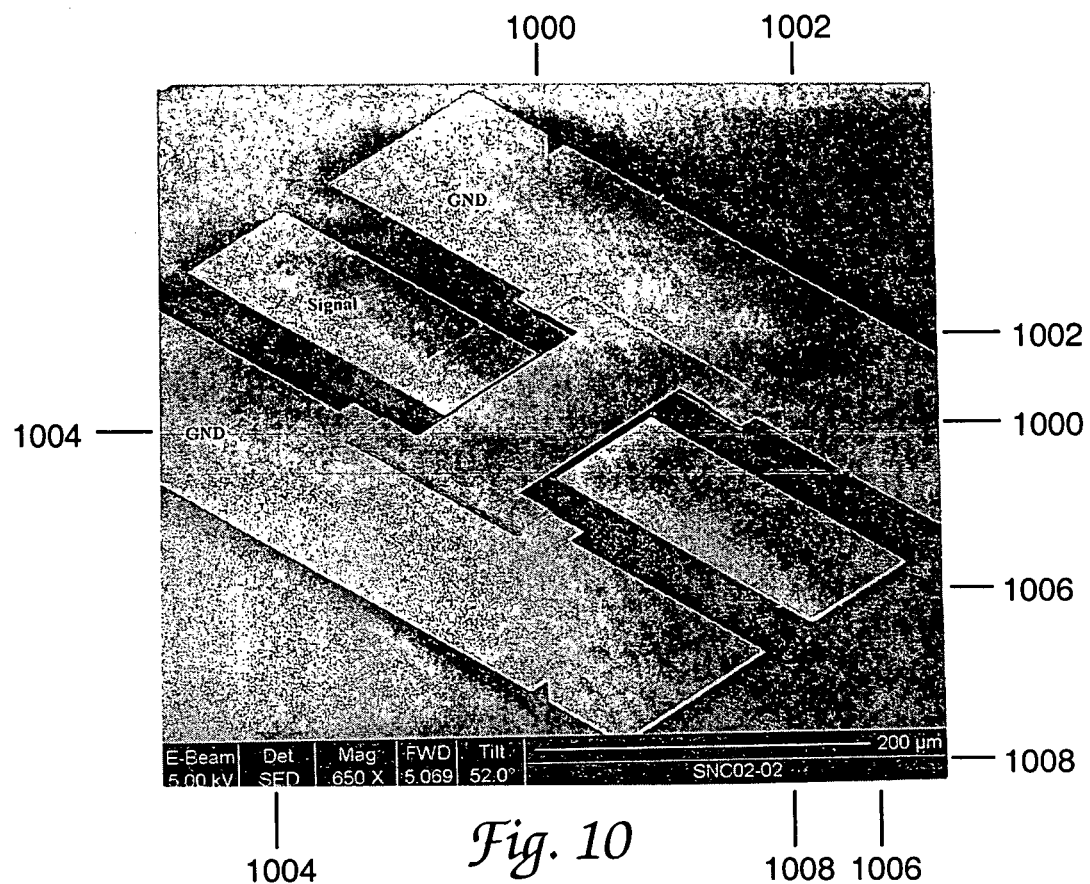
FIG. 10 in the drawings shows a present invention switch in unenclosed die condition.

MEMS radio frequency switches are typically fabricated in a coplanar waveguide configuration as shown in the scanning electron microscope-produced microphotograph of FIG. 10. In this FIG. 10 the bridge 1000 is anchored on the ground (GND) lines 1002 and 1004 and spans the center signal line 1006. By way of explanation, the FIG. 10 and several other of the microphotograph "drawings" herein originate in the form of mounted glossy photographic prints. In order to designate specific details in such "drawings", where drawn-in lead lines are impractical on the glossy photographic paper surface, the usual number and single lead line procedure is replaced with vertical and horizontal drawing coordinate lines each bearing the appropriate reference number and each located in a margin adjacent the glossy print surface. The two numbers 1000 relating to the FIG. 10 bridge structure provide an example of this arrangement in the FIG. 10 drawing. Additionally, the lower margin line at 1008 in FIG. 10 indicates the length of a 200 micrometer or 200 micron feature in the FIG. 10 photograph. Other details regarding scanning electron microscope variables used for the photograph also appear in the lower margin of FIG. 10 and each of the other microphotographs herein.

Operation of the FIG. 10 switch may be understood from a consideration of the FIG. 6L drawing. An RF signal is applied to the RF metal conductor 612 in FIG. 6L and passes into the switch area un-attenuated by the overarching bridge metal 614. To actuate the switch, a direct current (dc) voltage is superimposed on the RF signal, i.e. applied between the RF metal signal line 612 and the Bridge metal line 614. Electrostatic attraction pulls the bridge 614 into contact with the RF dielectric film 616 covering the RF metal signal line; the dielectric film 616 prevents an electrical short circuit between conductors 614 and 612. The resulting increased capacitance formed by the signal line 612, dielectric 616, and bridge 614 effectively shorts the RF signal between conductors 612 and 614. When the dc voltage is removed, the elastic restoring force of the structure pulls the bridge 614 up and allows the RF signal to pass.

The purpose of the encapsulation layer 602 is to protect the switch from environmental contamination, i.e. dust and moisture. The encapsulation layer does not interfere with switch motion or degrade RF performance.

Process Demonstration

The Fabrication Process described herein has been exercised in a class 100 clean room device fabrication facility. The following microphotograph-representing images describe graphically some of the results reached in developing this fabrication process. Notably the fabrication process integrates RF MEMS switches with dielectric shells. The radio frequency test measurements included in these results show the presence of a dielectric shell does not degrade switch performance.

Figure 8A:
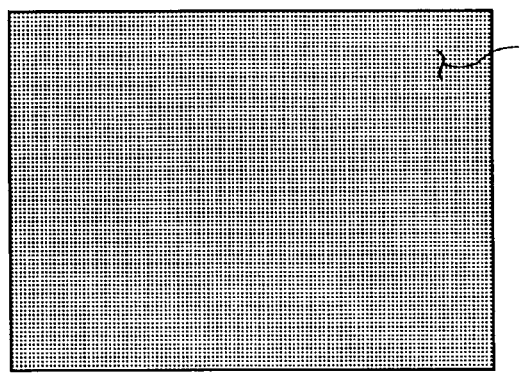
FIG. 8 in the drawings includes the views of FIG. 8A through FIG. 8J and shows a spin on glass sealing sequence for the hole and tunnel interior to exterior communication paths of a MEMS switch according to the present invention.
Figure 8B:
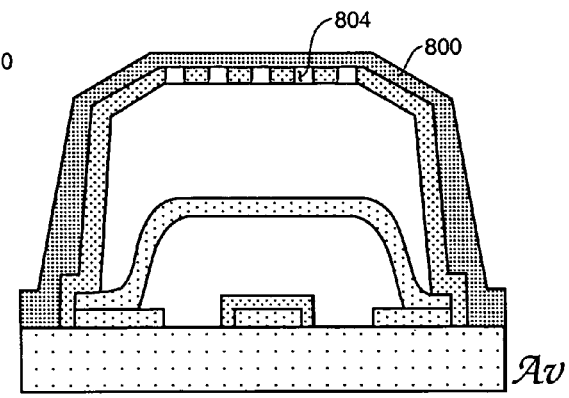
Figure 8C:
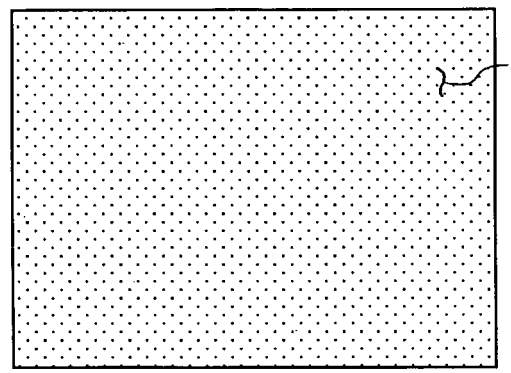
Figure 8D:
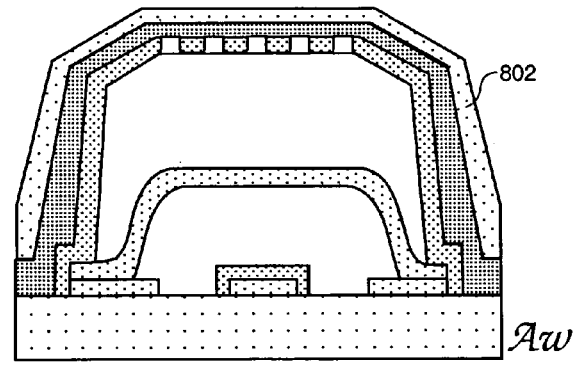
Figure 8E:
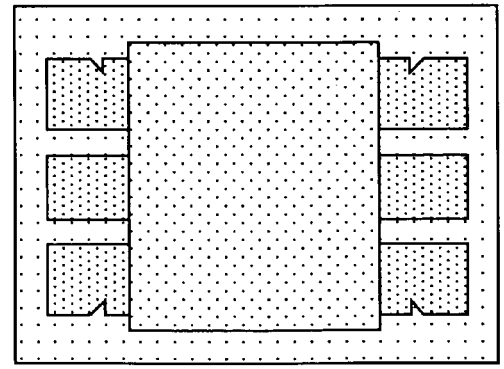
Figure 8F:
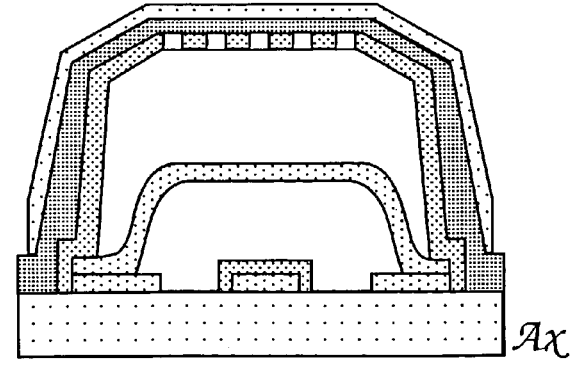
Figure 8G:
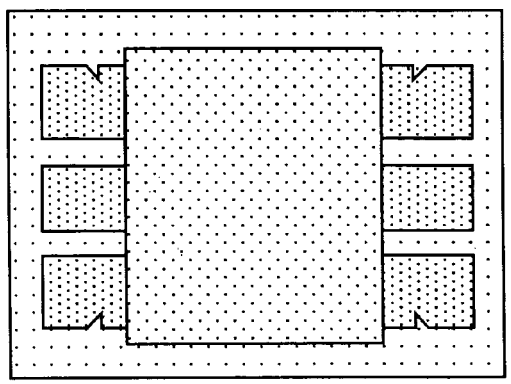
Figure 8H:
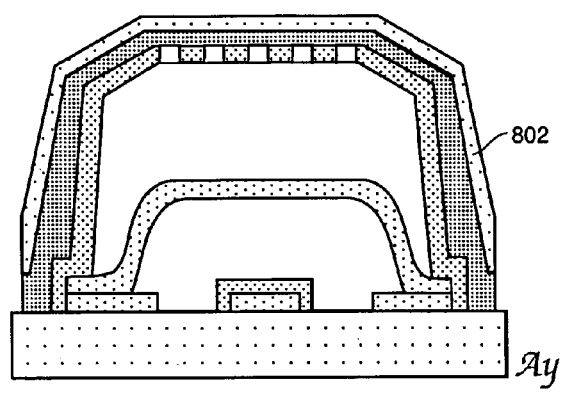
Figure 8I:
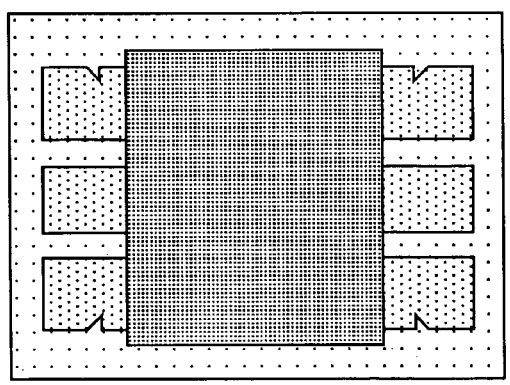
Figure 8J:
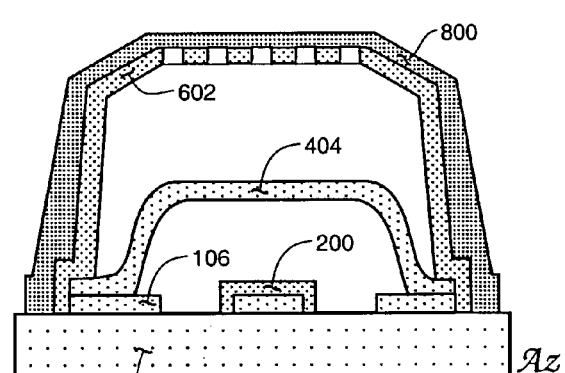

FIG. 11 in the drawings represents a scanning electron microscope micrograph showing a silicon nitride shell with the cylindrical holes at 804 in the FIG. 8B drawing appearing in the cap top. These holes are needed to remove the two sacrificial photoresist layers 508 and 312. The FIG. 11 nitride cap is disposed on a silicon substrate. The nitride cap brightness in the FIG. 11 image is due to the non-conductive nature of the material when viewed in an electron microscope. Note the crispness of the cap sidewalls in contacting the substrate surface and the slope of the cap in the region where the access holes are present. The FIG. 11 drawing additionally shows that the stress level in the silicon nitride film is well controlled (e.g. the cap is neither sagging nor buckled). Device dimensions and other details are shown along the lower edge of FIG. 11.

Figure 12:
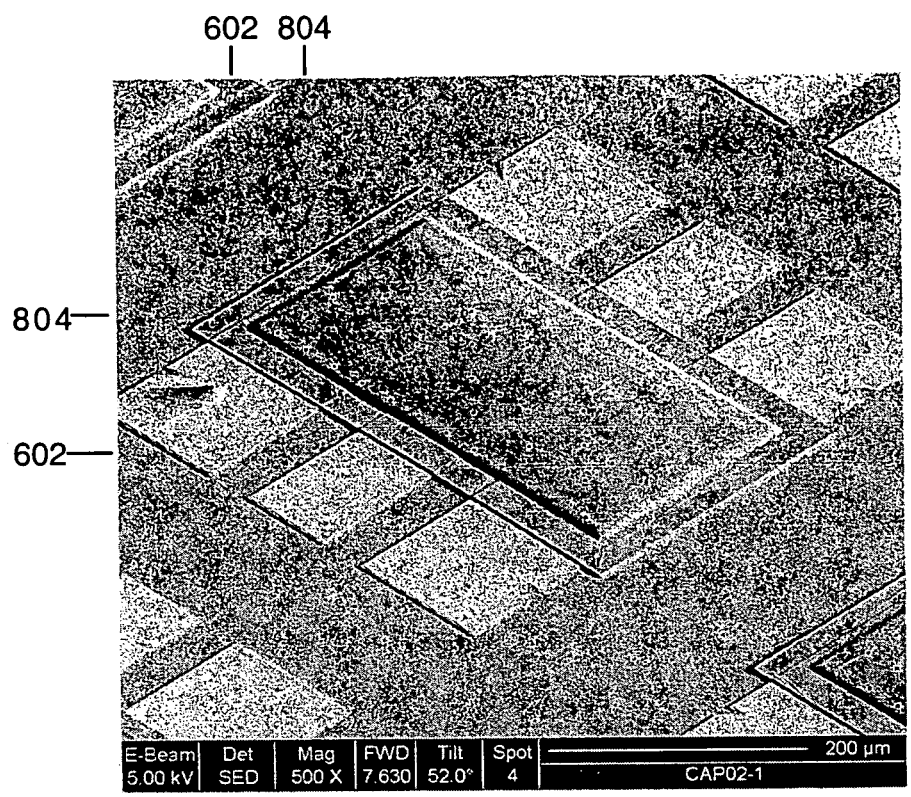
FIG. 12 in the drawings shows an enclosed MEMS switch according to the invention.

FIG. 12 in the drawings illustrates the cap 602 adhering to the ground and signal conductors and to the silicon substrate. The cap holes at 1204 are also clearly visible in FIG. 12. The FIG. 12 sample is flash coated with approximately 100 angstroms of gold for electron microscope viewing.

Figure 13:
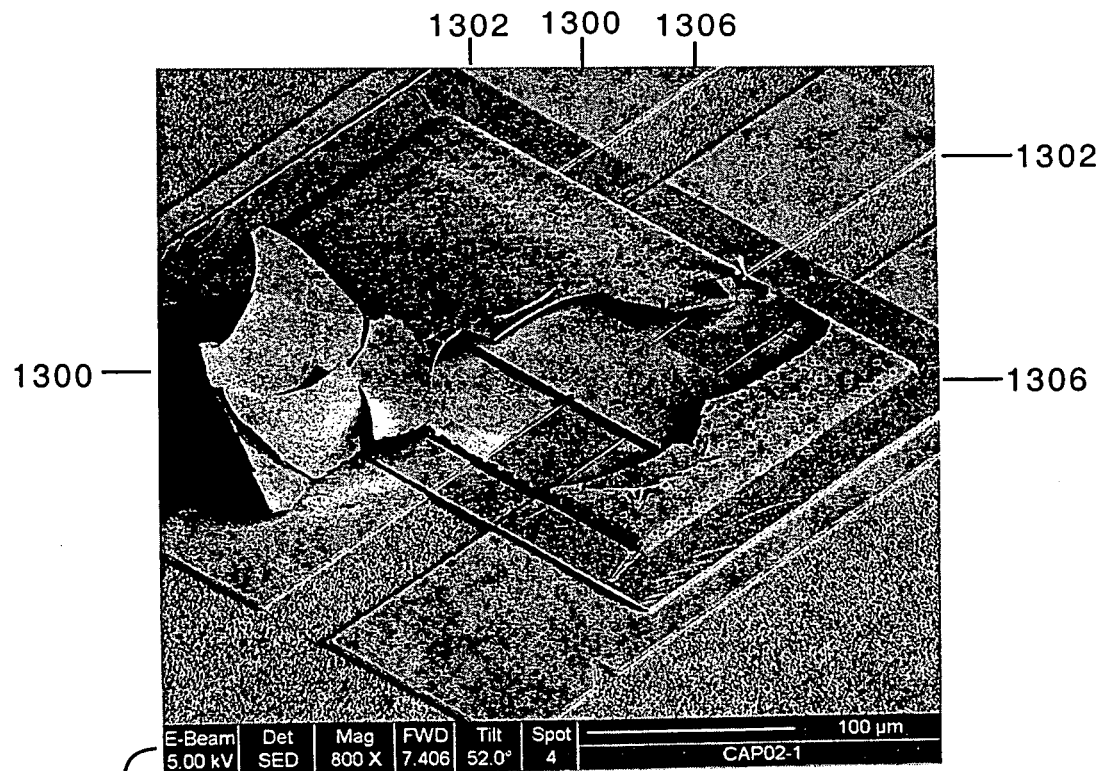
FIG. 13 in the drawings shows a switch of the FIG. 12 type in a ripped-open condition.

FIG. 13 in the drawings shows the FIG. 12 switch in a cut-away or torn-away condition. In this drawing the nitride cap is partially removed to reveal the switch underneath. The nick 1300 at the edge of the bridge structure is where an electrical probe tip was pushed into the bridge 1306 to verify switch integrity. Note that in addition to the gap between the MEMS switch bridge 1306 and the RF signal line 1304 and the substrate, a gap exists between the MEMS switch bridge 1306 and the normally located underside of the nitride cap 1302. The FIG. 13 sample is also flash coated with approximately 100 angstroms of gold for electron microscope viewing. Dimensions and other details also appear at the lower edge of FIG. 13.

FIG. 14 in the drawings shows a microphotograph including a switch that has been released from sacrificial layer captivity. In the FIG. 14 drawing there appears at 1400 and 1402 two metal conductors of the switch while at 1404 and 1406 the sapphire substrate is shown. A tunnel aperture for removal of sacrificial layer materials appears at 1408 in FIG. 14; these tunnels are shown in even better perspective in the scanning electron microscope view of the FIG. 15 microphotograph.

Figure 16:
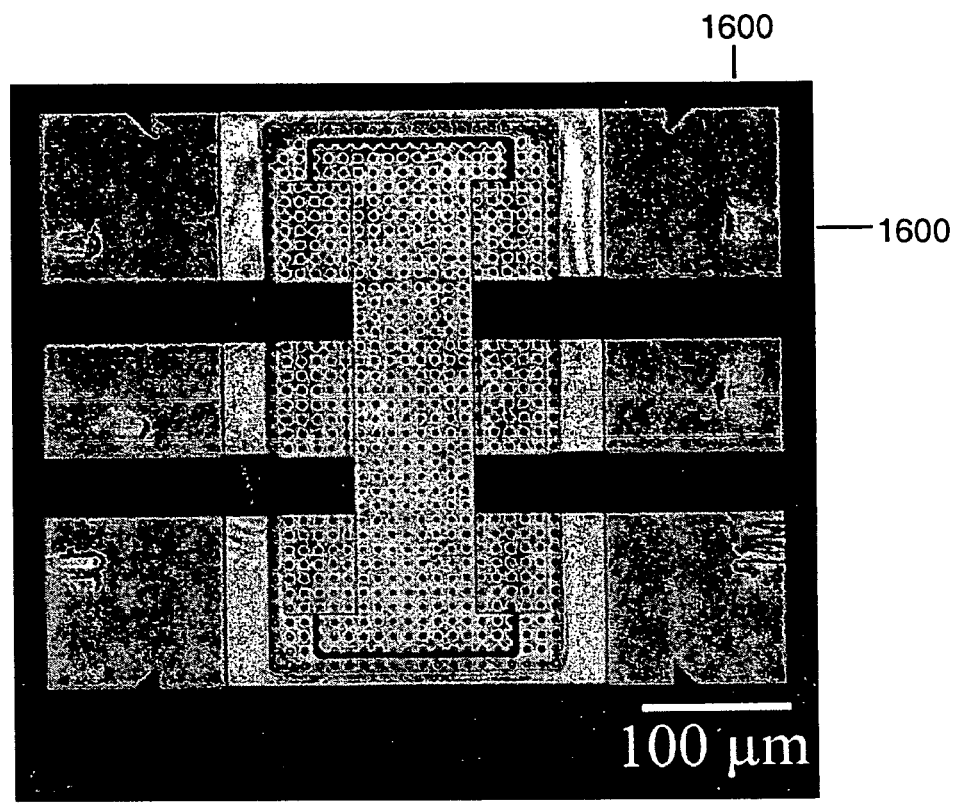
FIG. 16 in the drawings shows a MEMS switch with a silicon nitride cap in place.
Figure 17:
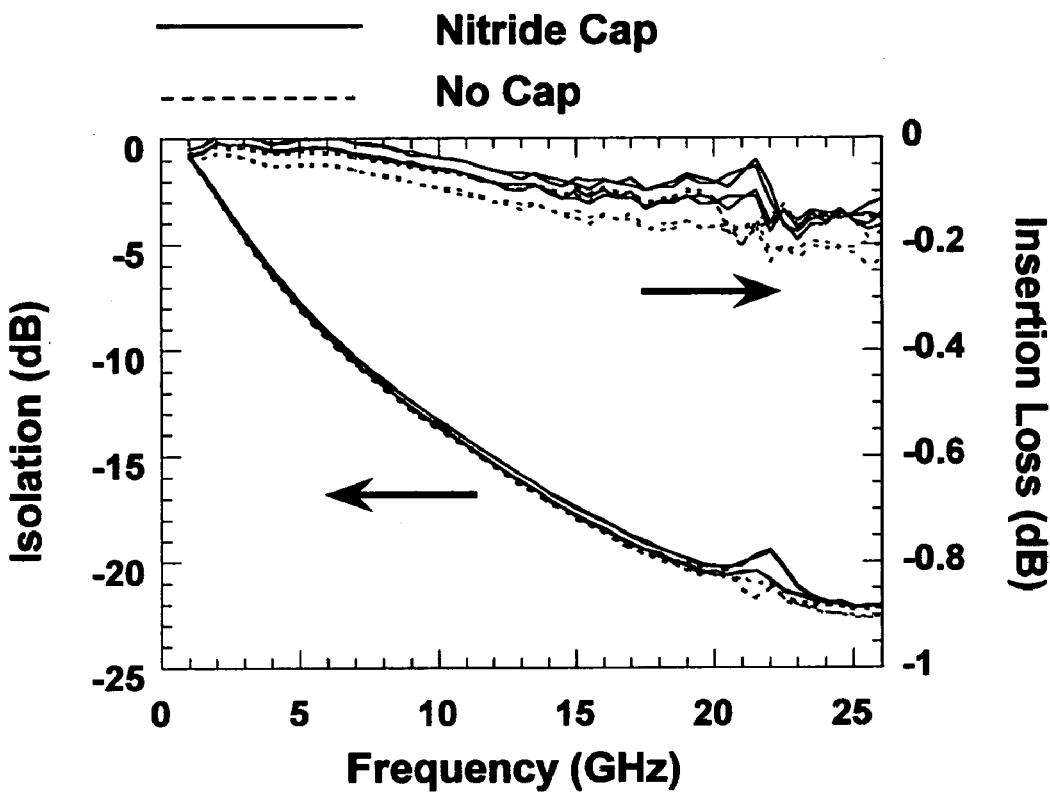
FIG. 17 in the drawings shows electrical performance of a capped switch according to the invention.

FIG. 16 in the drawings shows a microphotograph of a functional RF MEMS switch with a silicon nitride encapsulant on a sapphire substrate. RF probe marks as at 1600 appear on both sides of the ground and signal lines in FIG. 16. The result of RF test measurements made on the nitride capped devices and compared with switch performance measurements on non-capped capacitive RF MEMS switches are shown in the FIG. 17 drawing. These measurements indicate no loss in RF performance with the cap being present. In the FIG. 17 drawing the switch isolation of the lowermost curves relates to the left hand scale and switch insertion loss of the upper curves relate to the right hand scale. As indicated by the two FIG. 17 curves, no measurable loss from switch cap presence is observed. Switch insertion loss in FIG. 17 is less than 0.3 dB (at 26 GHz) and isolation is greater than 20 dB (at 26 GHz).

Figure 18:
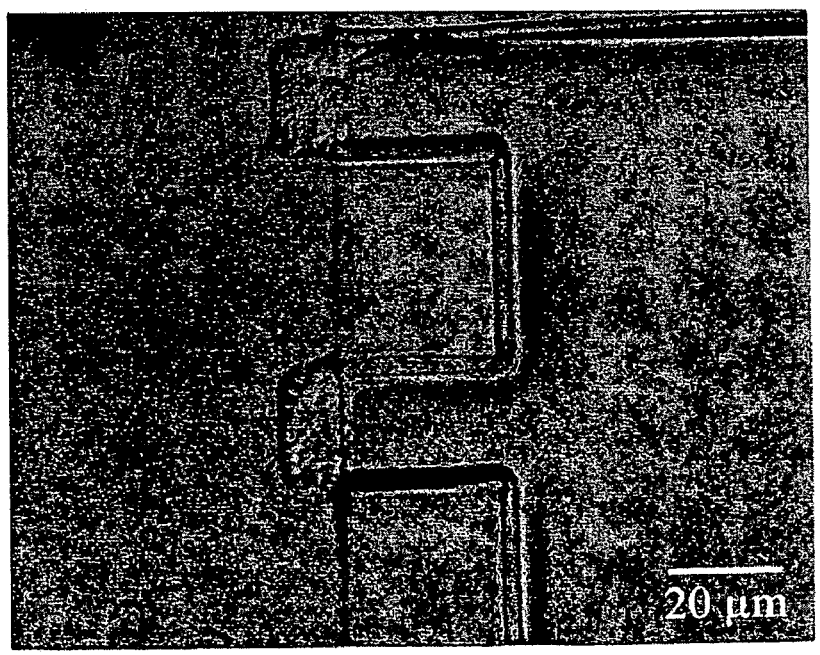
FIG. 18 in the drawings shows sealing of tunnels of the FIG. 15 type for the present invention.
Figure 20:
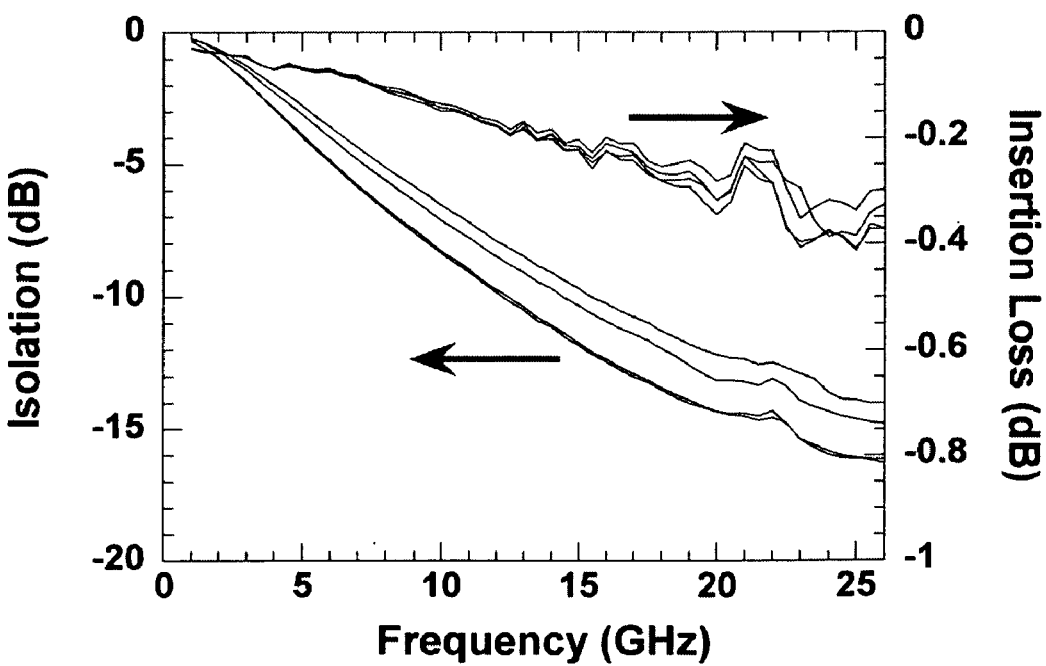
FIG. 20 in the drawings shows electrical performance for a capped and sealed switch according to the invention.
Figure 19:
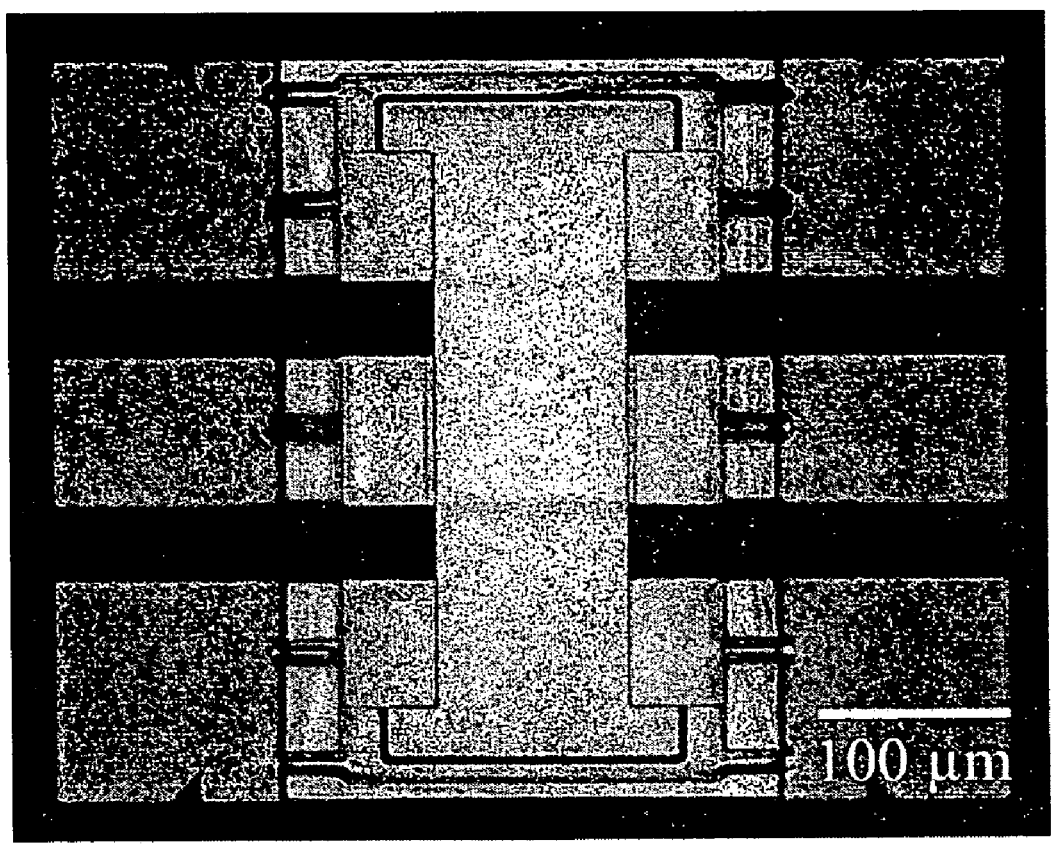
FIG. 19 in the drawings shows a PECVD sealed switch according to the invention.

Several methods may be used to seal the access holes or tunnels in the switch package of the present invention. The primary sealing approach using Plasma Enhanced Chemical Vapor Deposition (PECVD) achieves the sealing configuration shown in the FIG. 18 drawing where sealed access tunnels appear. Additional RF test measurements taken with PECVD sealed switches verify this sealing process also does not degrade switch performance. Test results for three sealed switches are shown in the FIG. 20 drawing where again both switch isolation and switch insertion loss are indicated. In the FIG. 20 drawing insertion loss is less than 0.3 dB (at 26 GHz) and isolation is 14-15 dB (at 26 GHz). FIG. 19 in the drawings shows a switch of the FIG. 16 type in an encapsulated and sealed condition. A dimension line in the lower right corner of FIG. 16 and FIG. 19 provides feature size indication.

ALTERNATIVES

Several alternatives in materials and processes may be employed in achieving the invention. These include the following:

Other high resistivity substrates, such as quartz, GaAs, or Si may be used.

Other materials may be used to seal the holes in the dielectric cap; materials such as Dow Corning Q1-4939 silicone; Honeywell Accuglass 512B; Electronic Materials Inc. OptoCast 3500 or 3600 series epoxies; Thermoset glob-top encapsulants; or solder shots.

A thin, stiff template similar to a shadow mask (such as made from stainless steel or other metal) could be made to include holes over the cap areas needing to be sealed. The template could be placed over the wafer containing the nitride caps and the sealing material, such as epoxy, could be flowed across the top of the caps with a squeegee or similar applicator.

A dry process can also be used to seal the access holes. Following an oven bake-out, a film is laminated over the encapsulated wafer and is heat cured. The sealed wafer is then patterned and the film removed from the contact pad areas.

A reflow process can also be used for access hole sealing. In this process, following an oven-bake out, glass or other frit beads are deposited on the wafer and reflowed to form a continuous film over the shells. The sealed wafer could then also be coated with photoresist, patterned, and etched to remove the glass film from the contact pad areas.

Once the RF MEMS switches are capped and access holes sealed additional process steps can be followed to hermetically seal the switch if required. For the case of the non-hermetic epoxy sealed cap, bake-out of the epoxy can be done in a controlled environment. A hermetic over-seal cap may then be placed on the individual switches as the next stage of the process. The individual devices can then be separated after wafer dicing and handled by conventional methods, such as by pick-and-place techniques. An attribute of the present invention is that it is multi-step in nature and allows for the possibility of hermetic sealing if needed.

ADVANTAGES AND NEW FEATURES

The present invention represents an integrated multi-step wafer-level process tailored to the fabrication and encapsulation of RF MEMS switches. The encapsulation arrangement is compatible with the switch fabrication process and utilizes the same sacrificial photoresist for both the device and dielectric shell. The sacrificial photoresist for the dielectric shell is cured at a lower temperature than the switch sacrificial layer to minimize secondary reflow of the switch sacrificial layer. The approach inherently protects the RF MEMS switch with sacrificial photoresist until the final process step when all the sacrificial photoresist is removed. Specifically, the dielectric encapsulant and RF MEMS devices are released simultaneously as a photoresist stripper penetrates cylindrical through-holes or tunnels patterned into the dielectric shell. A separate fabrication step seals the holes or tunnels in the dielectric shell to fully encapsulate each MEMS structure on the wafer. RF MEMS switches have been fabricated and released concurrently with a perforated silicon nitride shell covering them. The measured RF performance of suspended switches when tested up to 26 GHz does not show degradation due to the presence of the dielectric encapsulant.

The present invention involves a multi-step encapsulation method in which the shell is formed using a sputtered dielectric material such as silicon nitride or alumina. This shell has photo-lithographically defined access holes that are used to simultaneously release both the RF MEMS switch and the shell sacrificial photoresist. The access holes are sealed using silicon oxide or spin-on-glass or an epoxy layer. The resulting switches are sealed at atmospheric pressure or below atmospheric pressure and can thus provide sealed-in air for switch damping. In addition, the choice of photoresists and associated curing temperatures distinguish the present process.

The present invention concept is thus believed unique for the following reasons: (1) it allows for simultaneous release of both the MEMS switch and the dielectric encapsulating shell; (2) it provides options for sealing the dielectric shell access holes; (3) it is suitable for RF MEMS switch encapsulation, specifically the dielectric shell does not impede the RF performance of the devices; (4) the individual packaged switches can then be diced (or handled) and are suitable for further incorporation into an electronic circuit; (5) the sputtering technique used to deposit silicon nitride results in structurally sound cap shells; and (6) a multi-step concept has been demonstrated.

While the apparatus and method herein described constitute a preferred embodiment of the invention, it is to be understood that the invention is not limited to this precise form of apparatus or method and that changes may be made therein without departing from the scope of the invention, which is defined in the appended claims.

We claim:

1. The wafer scale, fabrication and packaging integrated, moderate temperature method of making a hermetically sealed transmission line coupled radio frequency MEMS switch comprising the steps of:
   forming an assemblage of operationally static, coupled, metallic elements of said transmission line and switch in each die location across a surface of an insulating wafer substrate member;
   disposing an electrical insulating coating of closed switch capacitance determining thickness over selected of said operationally static, coupled, metallic elements of said transmission line and switch in each said die location of said insulating wafer substrate member;
   coating said insulating substrate member and electrical insulating coated operationally static, coupled metallic elements with a three sub layer comprised removable first photoresist sacrificial layer in each said die location of said insulating wafer substrate member;
   depositing a shaped thin metal film movable switch element on a top surface of said removable first photoresist sacrificial layer in each said die location of said insulating wafer substrate member;
   covering said shaped thin metal film movable switch element and said three sub layer comprised removable first photoresist sacrificial layer with a three sub layer comprised removable second photoresist sacrificial layer in each said die location of said insulating wafer substrate member;
   enclosing said three sub layer comprised removable second photoresist sacrificial layer, said shaped thin metal film movable switch element and said three sub layer comprised removable first photoresist sacrificial layer in a permanent dielectric shell member in each said die location of said insulating wafer substrate member;
   said permanent dielectric shell member including a plurality of apertures communicating from within to external of said dielectric shell member in each said die location of said insulating wafer substrate member;
   extracting said removable sacrificial layers materials from within each said permanent dielectric shell member using a dissolving liquid process communicating via said dielectric shell member plurality of apertures in each said die location of said insulating wafer substrate member;
   encasing said permanent dielectric shell member with a layer of protecting and sealing material in each said die location of said insulating wafer substrate member;
   segregating said insulating wafer substrate member into a plurality of individual sealed switch-inclusive dice.

2. The wafer scale, fabrication and packaging integrated, moderate temperature method of making a hermetically sealed transmission line coupled radio frequency MEMS switch of claim 1 wherein said insulating wafer substrate member is comprised of sapphire material.

3. The wafer scale, fabrication and packaging integrated, moderate temperature method of making a hermetically sealed transmission line coupled radio frequency MEMS switch of claim 1 wherein said step of coating said insulating substrate member and electrical insulating coated operationally static, coupled metallic elements with a three sub layer comprised removable first photoresist sacrificial layer in each said die location of said insulating wafer substrate member includes a first elevated temperature induced photoresist reflow sequence.

4. The wafer scale, fabrication and packaging integrated, moderate temperature method of making a hermetically sealed transmission line coupled radio frequency MEMS switch of claim 3 wherein said step of covering said shaped thin metal film movable switch element and said three sub layer comprised removable first photoresist sacrificial layer with a three sub layer comprised removable second photoresist sacrificial layer in each said die location of said insulating wafer substrate member includes a second elevated temperature induced photoresist reflow sequence accomplished at a lower temperature than said first elevated temperature induced photoresist reflow sequence.

5. The wafer scale, fabrication and packaging integrated, moderate temperature method of making a hermetically sealed transmission line coupled radio frequency MEMS switch of claim 4 wherein each sub layer of said coating and covering steps includes a spin coat and elevated temperature cure sequence.

6. The wafer scale, fabrication and packaging integrated, moderate temperature method of making a hermetically sealed transmission line coupled radio frequency MEMS switch of claim 4 wherein each step of said method after said forming step is accomplished at a temperature of two hundred seventy degrees Celsius and below.

7. The wafer scale, fabrication and packaging integrated, moderate temperature method of making a hermetically sealed transmission line coupled radio frequency MEMS switch of claim 1 wherein said enclosing step permanent dielectric shell member is comprised of one of alumina and silicon nitride materials.

8. The wafer scale, fabrication and packaging integrated, moderate temperature method of making a hermetically sealed transmission line coupled radio frequency MEMS switch of claim 7 wherein said enclosing step permanent dielectric shell member is comprised of silicon nitride and said enclosing step includes a radio frequency sputtering sequence.

9. The wafer scale, fabrication and packaging integrated, moderate temperature method of making a hermetically sealed transmission line coupled radio frequency MEMS switch of claim 1 wherein said encasing step includes one of a plasma enhanced chemical vapor deposited silicon oxide, a spun-on-glass, and an epoxy materials.

10. The wafer scale, fabrication and packaging integrated, moderate temperature method of making a hermetically sealed transmission line coupled radio frequency MEMS switch of claim 1 wherein said deposing step thin metal film and said forming step metallic elements each include metallic gold material.

11. The limited temperature photoresist process of making a sealed, transmission line coupled, capacitance coupling change-operated radio frequency MEMS switch comprising the steps of:
    fabricating operationally static metallic elements of said transmission line and said switch on an insulating substrate member;
    disposing a permanent electrical insulating coating over selected of said operationally static metallic elements of said transmission line and switch;
    coating said insulating substrate member and permanent electrical insulating coated operationally static metallic elements with a multiple sub layer comprised photoresist first removable sacrificial layer;
    depositing a shaped thin metal film movable switch element on a top surface of said first removable sacrificial layer;
    covering said shaped thin metal film movable switch element and said photoresist first removable multiple sub layer comprised sacrificial layer with a photoresist second removable sacrificial layer;
    enclosing said photoresist second removable sacrificial layer, said shaped thin metal film movable switch element and said first removable sacrificial layer with a dielectric shell member;
    said enclosing dielectric shell member including a plurality of apertures communicating from within to external of said dielectric shell member;
    extracting said removable sacrificial layers materials from within said dielectric shell member using a dissolving liquid process communicating via said dielectric shell member plurality of apertures; and
    overlaying said dielectric shell member with a layer of protecting and said aperture-sealing material of differing material composition from said dielectric shell member.

12. The limited temperature photoresist process of making a sealed transmission line fed capacitance-coupled radio frequency MEMS switch of claim 11 wherein said fabricating step includes formation of planar transmission line elements and capacitance coupling MEMS switch elements.

13. The limited temperature photoresist process of making a sealed transmission line fed capacitance-coupled radio frequency MEMS switch of claim 11 wherein said step of disposing a permanent electrical insulating coating over selected of said operationally static metallic elements of said transmission line and switch includes sputtering a two thousand angstrom coating of alumina over said operationally static metallic elements.

14. The limited temperature photoresist process of making a sealed transmission line fed capacitance-coupled radio frequency MEMS switch of claim 11 wherein said step of coating said insulating substrate member and permanent electrical insulating coated operationally static metallic elements with a photoresist first removable sacrificial layer of selected periphery shape includes both a photoresist mask periphery shape determining and a photoresist reflow periphery shape determining.

15. The limited temperature photoresist process of making a sealed transmission line fed capacitance-coupled radio frequency MEMS switch of claim 11 wherein said step of enclosing said photoresist second removable sacrificial layer, said shaped thin metal film movable switch element and said first removable sacrificial layer with a dielectric shell member includes for a dielectric shell sputtered alumnina adhesion layer and forming a dielectric shell sputtered silicon nitride layer over said dielectric shell sputtered alumina adhesion layer.

16. The limited temperature photoresist process of making a sealed transmission line fed capacitance-coupled radio frequency MEMS switch of claim 11 wherein said enclosing dielectric shell member apertures comprise one of a plurality of tunnel members traversing a lower substrate adjacent extremity of said dielectric shell member and a plurality of hole members traversing a substrate-removed portion of said dielectric shell member.

17. The limited temperature organic photoresist coating materials based MEMS switch realization method comprising the steps of:
    fabricating metallic elements of said switch in a sequence of photoresist coating, masking, exposing and etching steps ending with MEMS switch elements being held captive on an insulating substrate in a multiple sacrificial layered coating of said photoresist materials;
    enclosing said captive switch elements in a dielectric shell using additional of said photoresist coating, masking, exposing and etching steps compatible with both said fabricating step photoresist coating, masking, exposing and etching steps and with structure formed during said fabricating step photoresist coating, masking, exposing and etching steps;
    said enclosing step including forming in said dielectric shell a plurality of apertures communicating from outside to inside thereof;
    wet releasing said switch elements from captivity within said dielectric shell by said sacrificial layer of said photoresist coating materials by way of reagent received through said plurality of apertures communicating from outside to inside of said dielectric shell; and
    covering said plurality of apertures communicating from outside to inside of said dielectric shell with a coating material temperature compatible with said switch elements and with said dielectric shell.

* * * * *